(12) United States Patent
Bazarsky et al.

(10) Patent No.: US 11,507,835 B2
(45) Date of Patent: Nov. 22, 2022

(54) NEURAL NETWORK DATA UPDATES USING IN-PLACE BIT-ADDRESSABLE WRITES WITHIN STORAGE CLASS MEMORY

(71) Applicant: Western Digital Technologies, Inc., San Jose, CA (US)

(72) Inventors: Alexander Bazarsky, Holon (IL); Ran Zamir, Ramat Gan (IL)

(73) Assignee: Western Digital Technologies, Inc., San Jose, CA (US)

( * ) Notice: Subject to any disclaimer, the term of this patent is extended or adjusted under 35 U.S.C. 154(b) by 353 days.

(21) Appl. No.: 16/896,134

(22) Filed: Jun. 8, 2020

(65) Prior Publication Data

US 2021/0383208 A1 Dec. 9, 2021

(51) Int. Cl.
*G06N 3/04* (2006.01)
*G06N 3/063* (2006.01)
(Continued)

(52) U.S. Cl.
CPC .................. *G06N 3/08* (2013.01); *G06N 3/04* (2013.01); *G06N 3/063* (2013.01); *G06N 3/0481* (2013.01);
(Continued)

(58) Field of Classification Search
CPC ............. G06N 3/08; G06N 3/04; G06N 3/063
(Continued)

(56) References Cited

U.S. PATENT DOCUMENTS 6,545,907 B1 4/2003 Lowrey et al.
7,075,841 B2 7/2006 Resta et al.
(Continued)

FOREIGN PATENT DOCUMENTS

CN 106485317 A 3/2017
CN 107301455 A 10/2017

OTHER PUBLICATIONS

Nielsen, Michael; "Neural Networks and Deep Learning, Chapter 2: How the backpropagation algorithm works" 2015; http://neuralnetworksanddeeplearning.com/chap2.html; 27 pages.
(Continued)

*Primary Examiner* — Ly D Pham
(74) *Attorney, Agent, or Firm* — Loza & Loza, LLP; Gabriel Fitch

(57) ABSTRACT

Methods and apparatus are disclosed for managing the storage of dynamic neural network data within bit-addressable memory devices, such phase change memory (PCM) arrays or other storage class memory (SCM) arrays. In some examples, a storage controller determines an expected amount of change within data to be updated. If the amount is below a threshold, an In-place Write is performed using bit-addressable writes via individual SET and RESET pulses. Otherwise, a modify version of an In-place Write is performed where a SET pulse is applied to preset a portion of memory to a SET state so that individual bit-addressable writes then may be performed using only RESET pulses to encode the updated data. In other examples, a storage controller separately manages static and dynamic neural
(Continued)

network data by storing the static data in a NAND-based memory array and instead storing the dynamic data in a SCM array.

22 Claims, 21 Drawing Sheets

(51) Int. Cl.
  *G06N 3/08* (2006.01)
  *G11C 13/00* (2006.01)
  *G11C 11/16* (2006.01)
  *G11C 11/54* (2006.01)
  *G11C 16/04* (2006.01)

(52) U.S. Cl.
  CPC .......... *G06N 3/084* (2013.01); *G11C 11/1675* (2013.01); *G11C 11/54* (2013.01); *G11C 13/0069* (2013.01); *G11C 16/0483* (2013.01); *G11C 2013/0076* (2013.01)

(58) Field of Classification Search
  USPC .......................................................... 706/21
  See application file for complete search history.

(56) References Cited

U.S. PATENT DOCUMENTS

| | | |
|---|---|---|
| 7,274,586 B2 | 9/2007 | Choi et al. |
| 7,463,520 B2 | 12/2008 | Aritome |
| 7,580,287 B2 | 8/2009 | Aritome |
| 7,983,069 B2 | 7/2011 | Hsu et al. |
| 8,199,566 B1 | 6/2012 | Fackenthal et al. |
| 8,725,935 B2 | 5/2014 | Huang et al. |
| 9,430,735 B1 | 8/2016 | Vali et al. |
| 9,530,491 B1 | 12/2016 | Uttarwar et al. |
| 9,646,243 B1 | 5/2017 | Gokmen |
| 9,880,760 B2 | 1/2018 | Inbar et al. |
| 10,090,044 B2 | 10/2018 | Achtenberg et al. |
| 10,430,328 B2 | 10/2019 | Sela et al. |
| 2010/0027329 A1 | 2/2010 | Lee et al. |
| 2012/0311262 A1 | 12/2012 | Franceschini et al. |
| 2013/0013860 A1 | 1/2013 | Franceschini et al. |
| 2015/0221348 A1* | 8/2015 | Tseng .................. G11C 11/5628 711/103 |
| 2016/0077968 A1 | 3/2016 | Sela et al. |
| 2016/0099057 A1 | 4/2016 | Dusija et al. |
| 2017/0068451 A1 | 3/2017 | Kenan et al. |
| 2017/0337466 A1 | 11/2017 | Bayat et al. |
| 2018/0075344 A1 | 3/2018 | Ma et al. |
| 2018/0232508 A1 | 8/2018 | Kursun |
| 2018/0330238 A1 | 11/2018 | Luciw et al. |
| 2019/0073259 A1 | 3/2019 | Qin et al. |
| 2019/0243787 A1 | 8/2019 | Mittal et al. |
| 2019/0258920 A1 | 8/2019 | Lie et al. |

OTHER PUBLICATIONS

Wong et al.; "Phase Change Memory: A comprehensive and thorough review of PCM technologies, including a discussion of material and device issues, is provided in this paper"; Proceedings of the IEEE; vol. 98, No. 12; Dec. 2010; https://nanoheat.stanford.edu/sites/default/files/publications/A126.pdf; 27 pages.

Chi et al.; "PRIME: A Novel Processing-in-memory Architecture for Neural Network Computation in ReRAM-based Main Memory;" 2016 ACM SIGARCH Computer Architecture News; Jun. 18, 2016; vol. 44, No. 3, pp. 27-39; IEEE Press; https://seal.ece.ucsb.edu/sites/seal.ece.ucsb.edu/files/publications/prime_isca_2016.pdf.

Choe et al.; "Near-Data Processing for Machine Learning"; 2017; International Conference on Learning Representations; https://openreview.net/pdf?id=H1_EDpogx; 12 pages.

Sullivan, John; "Merging Memory and Computation, Programmable Chip Speeds AI, Slashes Power Use"; Nov. 15, 2018; https://m.techxplore.com/news/2018-11-merging-memory-programmable-chip-ai.html; 5 pages.

Jia et al.; "A Microprocessor Implemented in 65nm CMOS with Configurable and Bit-scalable Accelerator for Programmable In-memory Computing"; Nov. 9, 2018; https://arxiv.org/pdf/1811.04047.pdf; 10 pages.

Valavi et al.; "A Mixed-Signal Binarized Convolutional-Neural-Network Accelerator Integrating Dense Weight Storage and Multiplication for Reduced Data Movement"; VLSI Symp. on Circuits (VLSIC); Jun. 2018; http://www.princeton.edu/~nverma/VermaLabSite/Publications/2018/ValaviRamadgeNestlerVerma_VLSI18.pdf, 2 pages.

Hadidi et al.; "Demystifying the Characteristics of 3D-Stacked Memories: A Case Study for Hybrid Memory Cube" Georgia Institute of Technology; Oct. 3, 2017; https://arxiv.org/pdf/1706.02725.pdf; 10 pages.

Park et al.; "A hybrid flash translation layer design for SLC-MLC flash memory based multibank solid state disk"; Microprocessors and Microsystems; vol. 35, Issue 1; Feb. 2011; pp. 48-59; https://doi.org/10.1016/j.micpro.2010.08.001.

Kim et al.; "A 68 Parallel Row Access Neuromorphic Core with 22K Multi-Level Synapses Based on Logic-Compatible Embedded Flash Memory Technology"; 2018 IEEE International Electron Devices Meeting (IEDM); 2018; 4 pages <https://ieeexplore.ieee.org/document/8614599>.

Liang et al.; "Cognitive SSD: A Deep Learning Engine for In-Storage Data Retrieval"; 2019 USENIX Annual Technical Conference; Jul. 2019; 17 pages <https://www.usenix.org/conference/atc19/presentation/liang>.

Srivastava et al.; "Dropout: A Simple Way to Prevent Neural Networks from Overfitting"; Journal of Machine Learning Research 15; 2014; 30 pages <https://www.cs.toronto.edu/~hinton/absps/JMLRdropout.pdf>.

\* cited by examiner

NEURAL NETWORK DATA UPDATES USING IN-PLACE BIT-ADDRESSABLE WRITES WITHIN STORAGE CLASS MEMORY

FIELD

The disclosure relates, in some embodiments, to storage class non-volatile memory (NVM) arrays. More specifically, but not exclusively, the disclosure relates to methods and apparatus for updating of neural network deep learning data within a storage class NVM array by controlling bit-addressable writes within the array.

INTRODUCTION

Deep learning (which also may be referred to as deep structured learning or hierarchical learning) relates to machine learning methods based on learning data representations or architectures, such as deep neural networks (DNNs), rather than to task-specific procedures or algorithms. Deep learning is applied to such fields as speech recognition, computer vision, and self-driving vehicles. Deep learning may be accomplished by, or facilitated by, deep learning accelerators (DLAs), e.g., microprocessor devices designed to accelerate the generation of useful neural networks to implement deep learning. Deep learning is an example of a type of multidimensional computation procedure that employs stochastic gradient-based optimization procedures to identify minima or maxima in a multidimensional space. Other examples include expectation-maximization procedures, regularized regression procedures, and stochastic gradient descent procedures.

Storage class memory (SCM) generally refers to a memory technology that has performance characteristics (e.g., speed) that fall between those of dynamic random access memory (DRAM) arrays and flash arrays (such as NAND-based non-volatile memory (NVM) arrays). One example of an SCM array is a phase-change memory (PCM) array, which allows for in-place bit-addressable writes (read-modify-writes). Herein, among other features, DLAs and other deep learning systems are described that selectively control in-place bit-addressable writes to update data efficiently within PCM arrays or other SCM arrays.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a device that includes: a non-volatile memory (NVM) array configured for bit-addressable writes; and processing circuitry. The processing circuitry is configured to: determine whether or not to pre-set a portion of memory within the NVM array to a first memory state before updating data stored within the NVM array, wherein the determination is based on an amount of change in the data to be updated; in response to a determination to pre-set the portion of memory, pre-set the portion of memory to the first memory state and then change only particular bits within the pre-set portion to a second memory state using bit-addressable writes to update the data; and in response to a determination to not pre-set the portion of memory, update the data by performing bit-addressable writes to update only particular bits of the stored data that need updating.

Another embodiment of the disclosure provides a method for use by a device that includes an NVM array configured for bit-addressable writes. The method includes: determining an amount of change in data to be updated within the NVM array; determining, based on the amount of change in the data to be updated, whether to update the data by performing an in-place write without pre-set or by performing an in-place write with pre-set; updating the data, in response to a determination to perform the in-place write without pre-set, by selectively performing individual bit-addressable writes within the data to update only particular bits of the data that need updating; and updating the data, in response to a determination to perform the in-place write with pre-set, by pre-setting a portion of the NVM array to a first memory state and then updating only particular bits within the pre-set portion to the second memory state to encode the updated data.

Yet another embodiment of the disclosure provides a device that includes: a first NVM array configured for block writes; a second NVM array configured for bit-addressable writes; and processing circuitry. The processing circuitry is configured to: store a first set of data for a multidimensional computation procedure in the first NVM array; generate a second set of data from the first set of data using the multidimensional computation procedure, wherein the second set of data has a rate of change that is greater than a rate of change of the first set of data; and store the second set of data in the second NVM array.

Still yet another embodiment of the disclosure provides a method for use by a device. The method includes: storing a first set of data for a multidimensional computation procedure in a first NVM array configured for block writes; generating a second set of data from the first set of data using the multidimensional computation procedure, wherein the second set of data has a rate of change that is greater than a rate of change of the first set of data; and storing the second set of data in a second NVM array configured for bit-addressable writes.

DETAILED DESCRIPTION

Figure 1:
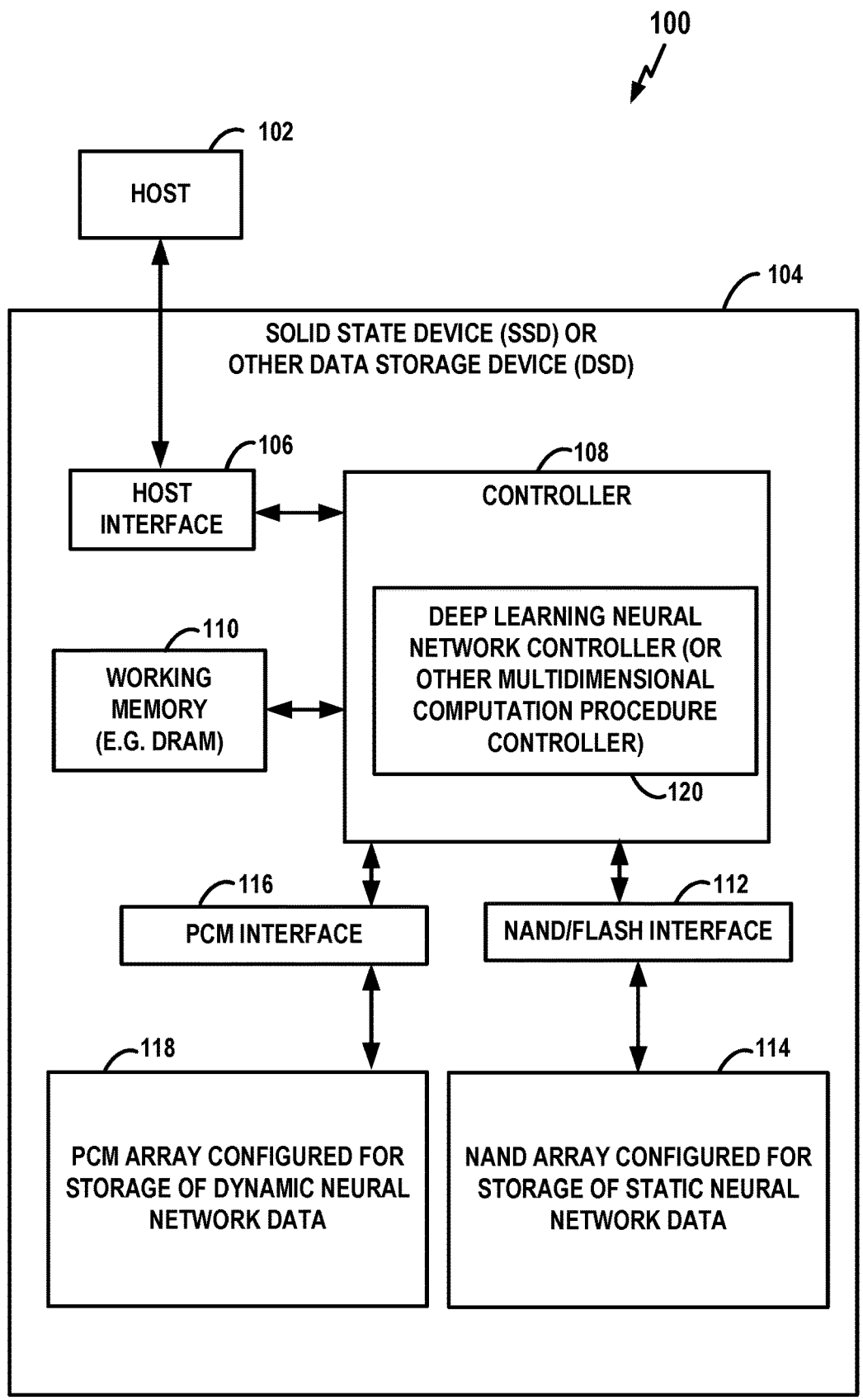
FIG. 1 shows a schematic block diagram configuration for an exemplary solid state device (SSD) having a PCM array and a NAND array, where neural network computations are performed by a controller of the SSD, dynamic neural network data is stored in the PCM array, and static neural network data is stored in the NAND array.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays and to data storage devices or apparatus for controlling the NVM arrays, such as a controller of a data storage device (DSD), e.g. a solid state device (SSD), and in particular to solid-state memory storage devices that include storage class memory (SCM) arrays. As noted above, SCM generally refers to a memory technology that has performance characteristics that fall between those of dynamic random access memory (DRAM) arrays and flash arrays, such as NAND-based arrays. One example of a SCM array is a phase-change memory (PCM) array, which allows for in-place bit-addressable writes. Other examples of SCM that allow for bit-addressable writes include magneto-resistive random access memory (MRAM) arrays, resistive random access memory (ReRAM) arrays, spin-transfer torque MRAM (ST-MRAM) arrays, and a three-dimensional cross-point (3D XPOINT) arrays.

In contrast, a NAND is a type of non-volatile storage technology that exploits negative-AND logic (hence the term NAND), which does not permit in-place bit-addressable writes. Briefly, to update data stored in a NAND array, an entire block or word-line of updated data is written to a free portion of the NAND array and then the block or word-line that had previously stored the data is marked for erasure so that it can be overwritten later. That is, conventional NAND arrays do not allow either for in-place writes (where stored data is overwritten in place with updated data) or bit-addressable writes (where individual bits can be written to as opposed to only writing entire blocks or word-lines of data).

For the sake of brevity, an SSD having one or more PCM dies will be used as a non-limiting example of a DSD below in the description of various embodiments. It is understood that at least some aspects described herein may be applicable to other types of data storage or memory devices as well, including other storage or memory devices that allow for bit-addressable writes (and which may or may not be classified as "storage class" memory). In addition, the various embodiments may be used or otherwise embodied in various machine learning devices such as accelerators or specialized processors which may include some combination of processing elements and memory/data storage elements, including the arrays constructed and/or configured in accordance with the described embodiments.

As noted above, deep learning may be accomplished by, or facilitated by, deep learning accelerators (DLAs), e.g., microprocessor devices designed to accelerate the generation of deep neural networks (DNNs) to implement deep learning. These networks may also be referred to as learning networks. Herein, methods and apparatus are disclosed for controlling or managing the updating of neural network data for DNNs or DLAs (or other multidimensional computation procedures) within a PCM array or other a bit-addressable array. In particular, methods and apparatus are disclosed for controlling procedures by which data is updated within the array based on an amount of change in data to be updated within the PCM array. In this regard, a significant feature of PCM arrays is the potential for in-place writes. A standard read-modify-write (RMW) process can be applied whenever data is to be written to PCM (or other types of SCM) so that only bits that need to be changed are actually changed. An RMW may be consume little power, particularly if few bits are to be changed. However, if a relatively large number of bits are to be changed, a more efficient update process may be preferred, which is referred to herein as an "In-place Write with Pre-set."

Herein, an In-place Write with Pre-set (abbreviated "IPWwP") refers to a data update operation where stored data is updated by (a) pre-setting all bit states of the data to be updated to the first memory state (e.g. 1), then (b) toggling or changing selected bits within the data to the second state (e.g. 0) using bit-addressable writes to encode the updated data into the array, without toggling or otherwise changing any of the bits of data from the second state to the first state. The IPWwP may also be referred as a "two-pass update." Pre-setting or initializing the bits to the first state is the first pass of the two-pass update. Toggling selected bits to the second state to encode the updated data is the second pass.

Within some types of SCM, such as a PCM, toggling or changing a bit to a first memory state (e.g. 1) from a second memory state (e.g. 0) is performed by applying a SET pulse. Toggling a bit from the first memory state (e.g. 1) back to the second memory state (e.g. 0) is performed by re-setting the bit using a RESET pulse. In a simple example where a single byte needs to be updated from 00100001 to 10000011, the IPWwP first sets all bits to 1 to yield 11111111 (which may be achieved by applying a SET pulse to the entire byte) and then performs individual bit-addressable writes to toggle the 2nd-6th bits from 1 to 0 to yield 10000011 (which may be achieved by applying a RESET pulse to the selected bits).

With an IPWwP, the updated data replaces the previous data (e.g., a buffer to be updated is overwritten with the updated data). It should be noted that, alternatively, the SET pulses of an IPWwP might be applied to a separate portion of the memory array with the updated data then stored to the separate portion of the memory array (and with the original buffer then marked for erasure). Herein, the term In-place Write with Pre-set is intended to broadly cover either option. However, in the examples below, unless stated otherwise, it is to be assumed that the updated data will replace the original data.

Herein, an "In-Place Write without Pre-set" (abbreviated "IPW") refers to an update where stored data is updated using bit-addressable writes by (a) selectively toggling or changing some bits from a first memory state to a second memory state and (b) selectively toggling or changing other bits from the second memory state to the first memory state. The IPW may be part of an otherwise standard in-place RMW operation. The IPW may also be referred to as a "single-pass update" since it does not require an initial pass to SET the bits to the first memory state. During the single pass, some bits are toggled to the first memory state (e.g. 1) from the second memory state (e.g. 0) using SET pulses and other bits are toggled from the first memory state (e.g. 1) to the second memory state (e.g. 0) using RESET pulses. In the simple example where a single byte needs to be updated from 00100001 to 10000011, the IPW performs a first bit-addressable write to change the first bit from 0 to 1 (by applying a SET pulse), a second bit-addressable write to change the third bit from 1 to 0 (by applying a RESET pulse), and a third bit-addressable write to change the seventh bit from 0 to 1 (by applying a SET pulse). No other bits need to be changed to update 00100001 to 10000011.

As explained in more detail below, within at least some types of SCM, such as a PCM, the SET pulse takes much longer than the RESET pulse but consumes less power. Hence, if relatively few bits need to be flipped to update data, the IPW may be preferred since relatively few pulses of either type (SET or RESET) are needed, and hence relatively little power is consumed compared to the IPWwP, which includes pre-setting all of the bits to the SET state. However, if a relatively large number of bits need to be flipped to update the data, the IPWwP may be preferred, particularly if the bits can be SET in advance, since the subsequent individual bit writes to encode the updated data can be very fast (as they are all fast RESET pulses) and the difference in power consumption is not likely to be significant.

Thus, whether an IPWwP is preferred over an IPW (for a particular set of data to be updated) may depend, at least in part, on the number of individual bit-addressable writes (e.g. bit flips) that will need to be performed to update the data, as well as on whether a portion of the array can be SET in advance before the data to be updated is received.

In illustrative examples described below, a device determines, estimates or predicts an amount of change in the data to be updated for comparison against a threshold. If the number is below the threshold, an IPW is performed on the stored data. Otherwise, the IPWwP is performed where the SET pulse is applied to SET a portion (or buffer) of memory to the high state so that individual bit-addressable writes may be performed using only RESET pulses to encode the updated data. In some particular examples described herein, the data to be updated is neural network data generated by a DLA and the predictions or estimates of the number of bits that need to be updated is made based on parameters representative of the current state of the DLA, such as a current learning rate.

In some DNN examples, data is intentionally not updated in an effort to prevent or remedy overfitting within a DNN to regularize the DNN to escape from local minima and converge to global minima or maxima in the DNN. For example, synaptic weights may be updated only if the amount of change in the weights is large enough (e.g. exceeds some threshold) as measured or quantified based on a number of bit-flips needed to update the data or based on some other measurement criteria. By selectively disabling the updating of synaptic weights, storage or memory "errors" are thereby introduced that may serve to prevent overfitting. Note also that various gradations or variations may be implemented between (a) performing an IPW or (b) performing an IPWwP where every bit in a buffer to be updated is Pre-Set. For example, some percentage of bits with the buffer may be preset, or only some portion of a buffer may be preset whereas other portions are not. As will be explained below, other thresholds may be used to enable or disable updates to control regularization.

Using these various techniques, an SCM management process is provided that can improve or optimize the tradeoff between IPW and IPWwP updates.

Still further, the DSD may separately control or manage the storage of static neural network data (such as input neural network data) and dynamic neural network data (such as synaptic weights). For example, static neural network data may be stored in a NAND-based NVM, whereas dynamic neural network data may be stored in PCM (or other SCM). The aforementioned bit-addressable writes may be selectively performed within the dynamic neural network data of the PCM, whereas storage within the NAND-based NVM may be controlled using NAND-based storage procedures. In this manner, an SCM array may be utilized as a short-duration, fast-response working-area (or work sheet) for neural network optimization procedure (or other multi-dimensional computation procedures). These techniques serve to enable the implementation of large-scale, non-urgent computations at the memory level of a system (e.g. within a DSD) without the need to utilize external bus lines toward a host and host resources (or other computation units outside the memory level).

The DSD may be configured to implement neural network processing components, such as DLA feedforward and back-propagation components, on or in the PCM die using under-the-array or other extra-array circuit components. Examples that incorporate DLA components in a PCM die may be referred to herein as DLA PCM arrays or DLA PCM architectures. Additionally or alternatively, a NAND-based NVM die may be equipped with the neural network processing components for use in conjunction with the PCM die.

Note that a DNN is an example of an artificial neural network that has multiple layers between input and output layers. A DNN operates to determine a mathematical computation or manipulation to convert the input into the output, which might be a linear or non-linear computation. For example, the DNN may work through its layers by calculating a probability of each output. Each mathematical manipulation may be considered a layer. Networks that have many layers are referred to as having "deep" layers, hence the term DNN. In one particular example, the DNN might be configured to identify a person within an input image by processing the bits of the input image to yield identify the person, i.e. the output of the DNN is a value that identifies the particular person.

DNNs are often configured as feedforward networks, in which data flows from an input layer to an output layer in one direction. Initially, the DNN may generate a map of virtual "neurons" and assign initial numerical values or "weights" to connections between the neurons. The weights and inputs are multiplied to return output values between, e.g., 0 and 1. The weights may be adjusted in an attempt to improve the accuracy by which the network relates its input to a known output (to, for example, correctly identified an input image).

In one aspect of a DLA of a DNN, a feedforward computation for a single neuron activation in DNN is given by Equation 1 below, where multiply-accumulate (MAC) operations using synaptic weights are summed and then an activation function is calculated, which is often a maximum function (such as a rectifier linear activation function computed by a rectifier linear unit (RLU or ReLU)) or a sigmoid function. That is, in some examples, the feedforward computation involves a sum over weights (w or w) multiplied by input values (a, z) to each neuron in the network plus a bias value (b), the result of which is then applied to a sigmoid activation function (σ) to yield the next value in the network.

$$a_j^l = \sigma\left(\sum_k w_{jk}^l a_k^{l-1} + b_j^l\right) \tag{1}$$

In Equation 1, $w_{jk}^l$, denotes the weight for a connection from a $k^{th}$ neuron (or node) of the neural network) in an $(l-1)^{th}$ layer of the neural network to a $j^{th}$ neuron in an $l^{th}$ layer. The term $b_j^l$ denotes a bias of the $j^{th}$ neuron in the $l^{th}$ layer and $a_j^l$ denotes the activation of the $j^{th}$ neuron in the $l^{th}$ layer. Thus, the activation $a_j^l$ of the $j^{th}$ neuron in the $l^{th}$ layer is related to the activations in the $(l-1)^{th}$ layer. Note also that in Equation 1 the sum is over all neurons k in the $(l-1)^{th}$ layer. That is, for each layer, the weight w of each of the k neurons in the layer is multiplied by a corresponding activation value for the neuron, the values of this intermediate computation are summed together. This is the aforementioned MAC operation which multiplies individual w and a values and then accumulates (i.e. sums) the results. The appropriate bias value b is then added to the output of the MAC and result is applied to the sigmoid activation function (σ) to obtain the next activation value a. Note also that the zeroth layer of the neural network may be referred to as the input layer, the first layer of the neural network may be referred to as the first hidden layer, and the final layer of the neural network may be referred to as the output layer.

DLA learning schemes may be based on solving back-propagation equations to update the network weights (w or ω). Exemplary backpropagation equations are based on weighted sums using calculated δ terms (in the equations below in a matrix and vector form) for the output and so-called hidden layer neurons in the DNN (i.e. the intermediate layers between the input layer and the output layer) and wherein training values are employed.

Briefly, a cost function C (or loss function) or may be defined:

$$C = \frac{1}{2n}\Sigma_x \|y(x) - a^L(x)\|^2 \tag{2}$$

where n is a total number of training examples x, the sum is over individual training examples, x; y=y(x) is a corresponding desired output (e.g. a known output); L denotes the number of layers in the network; and $a^L=a^L(x)$ is a vector of activations output from the neural network when x is input.

Error values δ may be defined based on the cost function (loss function) and a weighted input values z:

$$\delta_j^l = \frac{\partial C}{\partial z_j^l}. \tag{3}$$

where $\delta_j^l$ is the error of a neuron j in a layer l and where $z_j^l$ is a weighted input for the neuron j in the layer l. It is noted that the error $\delta_j^l$ is equal to a rate of change of C relative to the bias value b for the jth neuron of the lth layer, e.g.:

$$\frac{\partial C}{\partial b} = \delta \tag{4}$$

where δ is evaluated at the same neuron as the bias b.

Four main backpropagation equations may then be defined:

$$\delta^L = \nabla_a C \odot \sigma'(z^L). \tag{5}$$

$$\delta^l = \left((w^{l+1})^T \delta^{l+1}\right) \odot \sigma'(z^l) \tag{6}$$

$$\frac{\partial C}{\partial b_j^l} = \delta_j^l \tag{7}$$

-continued $$\frac{\partial C}{\partial w_{jk}^l} = a_k^{l-1} \delta_j^l \quad (8)$$

As these are standard backpropagation equations, they will not be described in detail herein, other than to note that the T of Equation (6) indicates a matrix transpose, the σ' of Equation (6) denotes a derivative of the sigmoid function σ, and the symbol ⊙ denotes a Hadamard product, i.e. an elementwise product of two vectors.

Based on these equations (or, in some cases, other standard backpropagation equations), the synaptic weights (w or ω) of the DNN may be updated based on a desired output of the neural network y=y(x) provided by the user, which may be input for training purposes and used in conjunction with the existing bias values b, weights (w or ω) and activation values a and z values already stored. For example, the desired outputs, y(x), sometimes called in the literature "learning labels" or "learning targets" of a supervised learning scheme may be provided by the user/host device to the DLA NAND. DNN backpropagation equations have fixed inputs (z), which are input to backpropagation Equation 6, that are not changed and can be stored in static memory and dynamic values (C and δ and ω (or w) that are adjusted or computed temporarily within Equations 5-7 and would benefit from storage in dynamic memory.

Herein, the term "static data memory" refers to memory that has been configured for, or optimized for, storing data that is not updated at all or updated only rarely (e.g. z values). Herein, the term "dynamic data memory" refers to memory that has been configured for, or optimized for, storing data that is updated frequently (e.g. C, δ and ω (or w) values). In some examples, static data is data that does not change at all during the multidimensional computation procedure and dynamic data is data that changes during the multidimensional computation procedure. In other examples, static data may be distinguished from dynamic data based on how often or how significantly the data changes as quantified by some criteria, metric or threshold values. For instance, static data may be defined as data that changes slower than a first threshold rate during the multidimensional computation procedure and dynamic data may be defined as data that changes faster than a second (different) threshold rate during the multidimensional computation procedure. The first threshold rate may be preprogrammed or otherwise set to a value representative of rare or infrequent changes to the data, whereas the second threshold rate may be preprogrammed or otherwise set to a value representative of frequent changes to data. The particular thresholds, metrics or other criteria used to distinguish static data from dynamic data may depend on the particular multidimensional computation procedure and other factors. (Note that thresholds used to distinguish static data from dynamic data should not be confused with other thresholds used to determine whether to perform IPW vs. IPWwP.)

Thus, in some examples described herein, a high performance DNN system is disclosed that includes PCM arrays (or other SCM-based arrays, but will be referred to as PCM below for brevity) and flash NAND dies, where static data (e.g. z) and dynamic data (e.g. C and δ and ω) are stored and managed separately, with the dynamic data stored in the PCM arrays and the static data stored in the NAND dies. Still further, in some examples described herein, the DNN system selectively controls the updating of dynamic data in the PCM arrays using either IPW or IPWwP. Although described primarily with reference to DNN examples, many features described herein can be applied to the storage of data for other types of processing systems, such as expectation-maximizations systems, regularized regression, stochastic gradient descents, etc. In some embodiments, the flash NAND may be replaced with other types of non-volatile memory, such as SCM. For brevity, static data will be generally described as being stored in a NAND array in the following examples.

Exemplary Devices, Systems, Procedures and Apparatus

Figure 2:
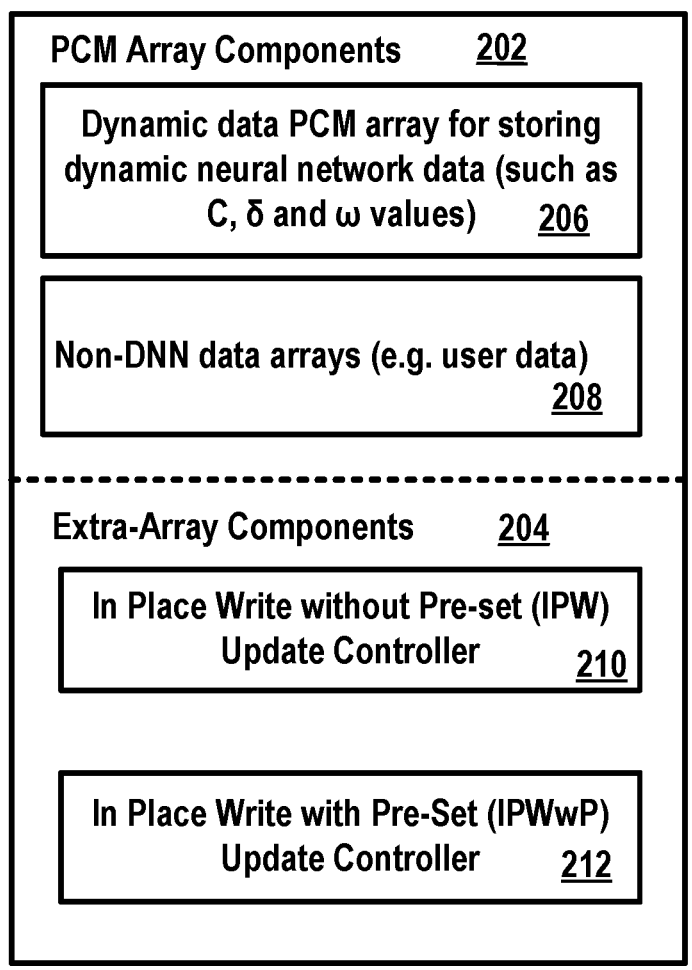
FIG. 2 illustrates an exemplary PCM die with extra-array components configured to control updates of dynamic neural network data using place bit-addressable writes.
Figure 3:
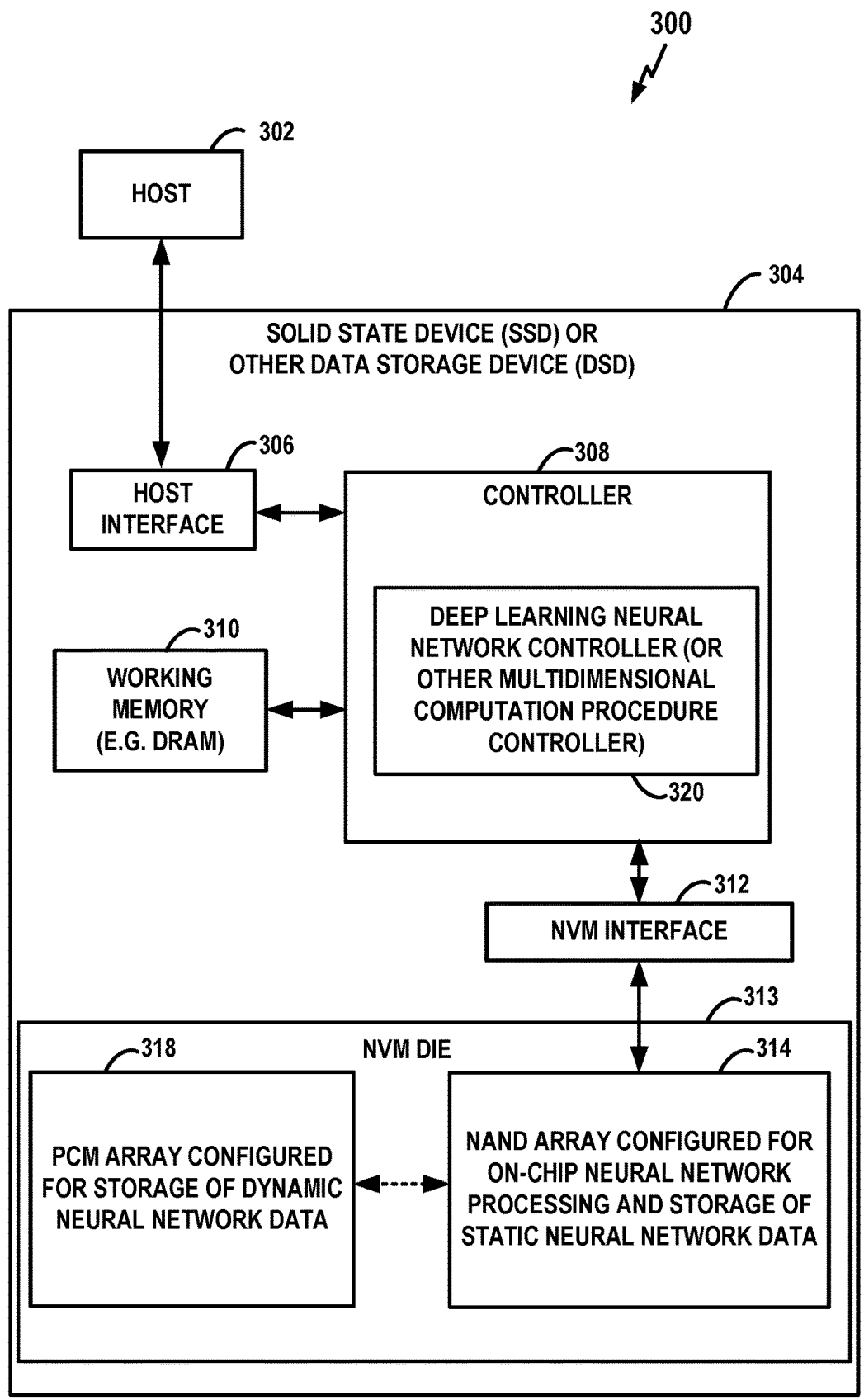
FIG. 3 shows a schematic block diagram configuration for an exemplary SSD having an NVM die with a PCM array and a NAND array, where neural network computations are performed by circuitry within the NVM die with the resulting dynamic neural network data is stored in the PCM array and with static neural network data stored in the NAND array.
Figure 4:
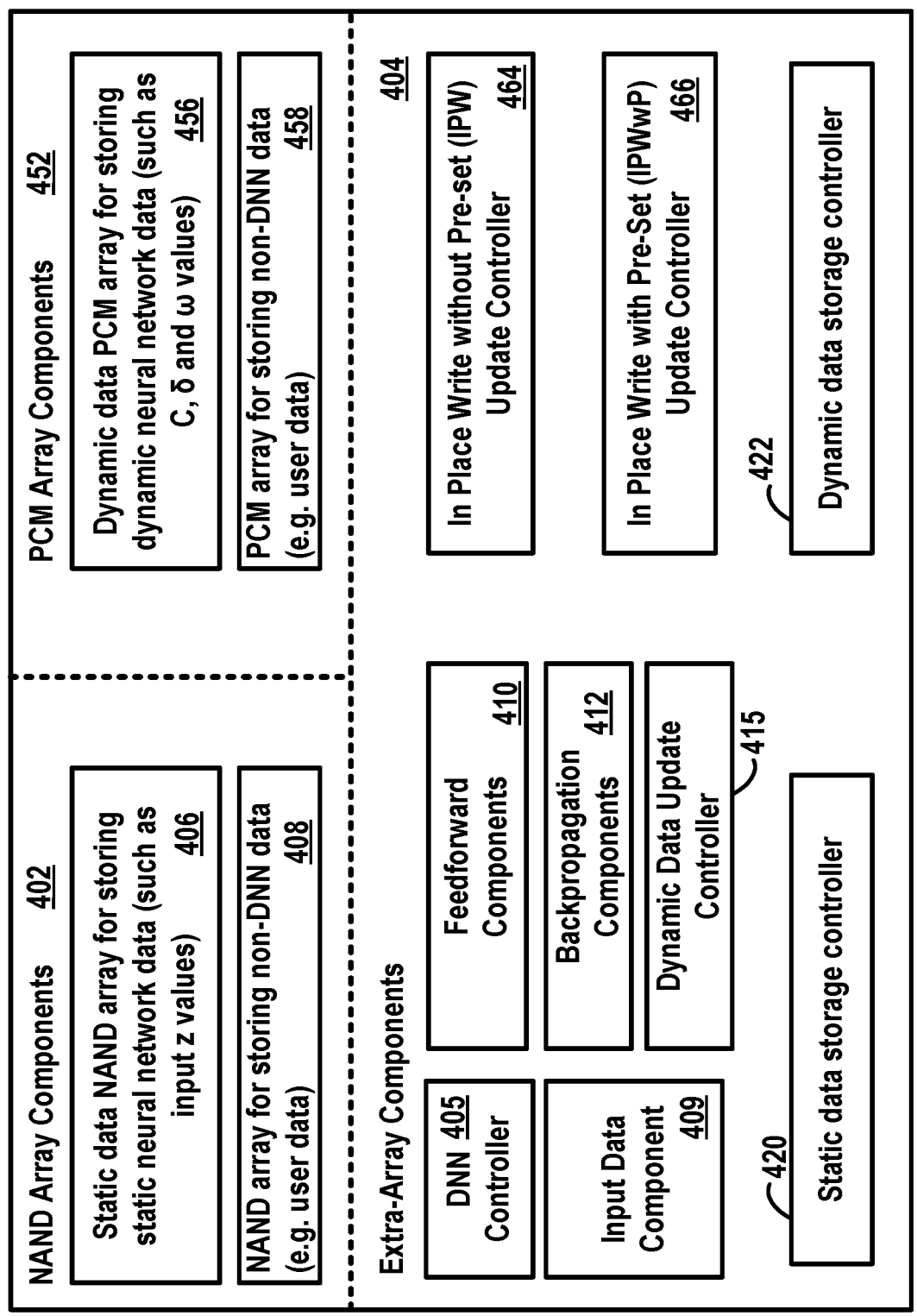
FIG. 4 illustrates an exemplary NVM die with PCM and NAND arrays and with extra-array components configured to generate dynamic neural network data for storage within the PCM array using place bit-addressable writes.
Figure 5:
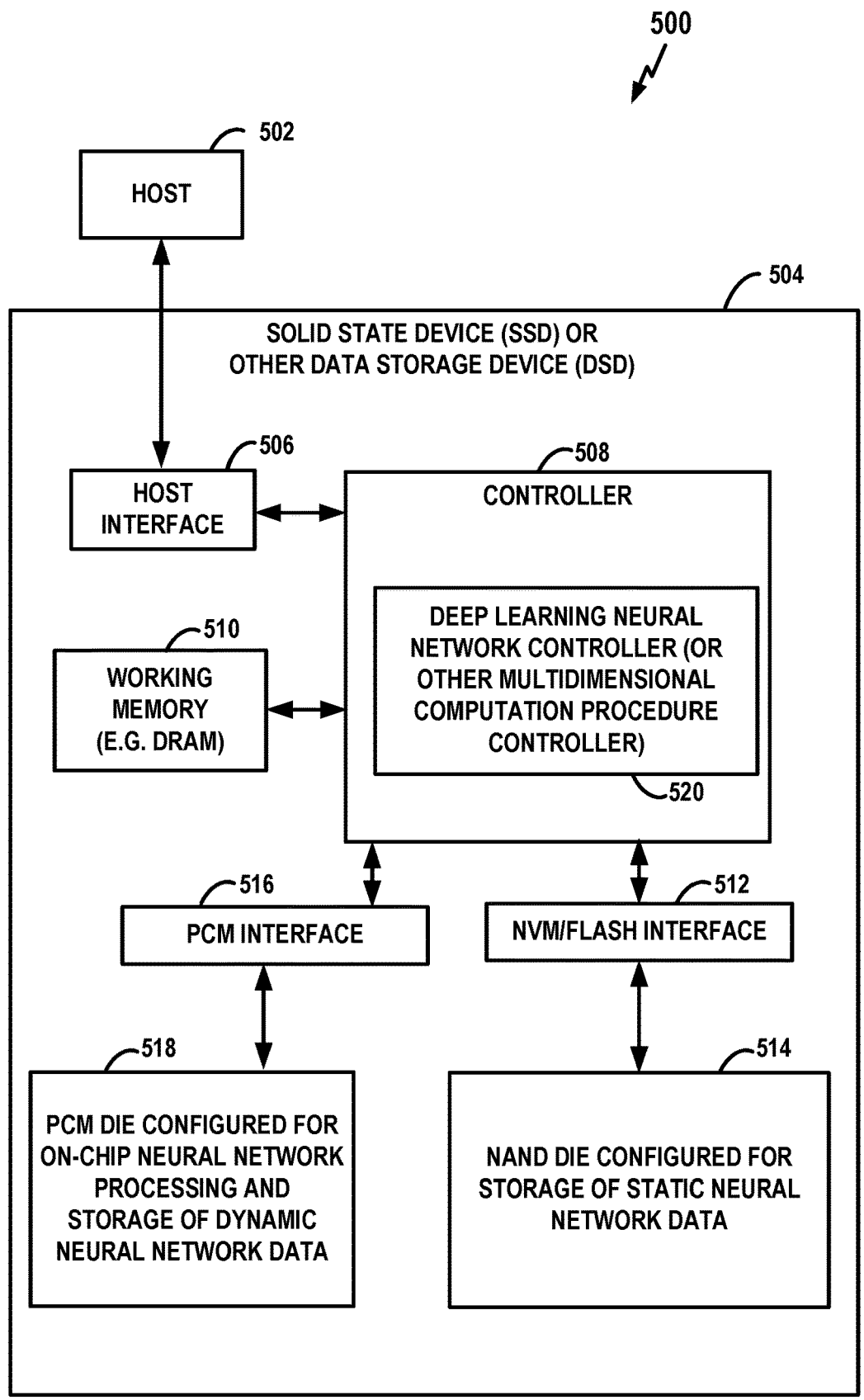
FIG. 5 shows a schematic block diagram configuration for an exemplary SSD having a PCM die and a NAND die, where neural network computations are performed by circuitry within the PCM die and the resulting dynamic neural network data is stored in the PCM die while static neural network data is stored in the NAND die.
Figure 6:
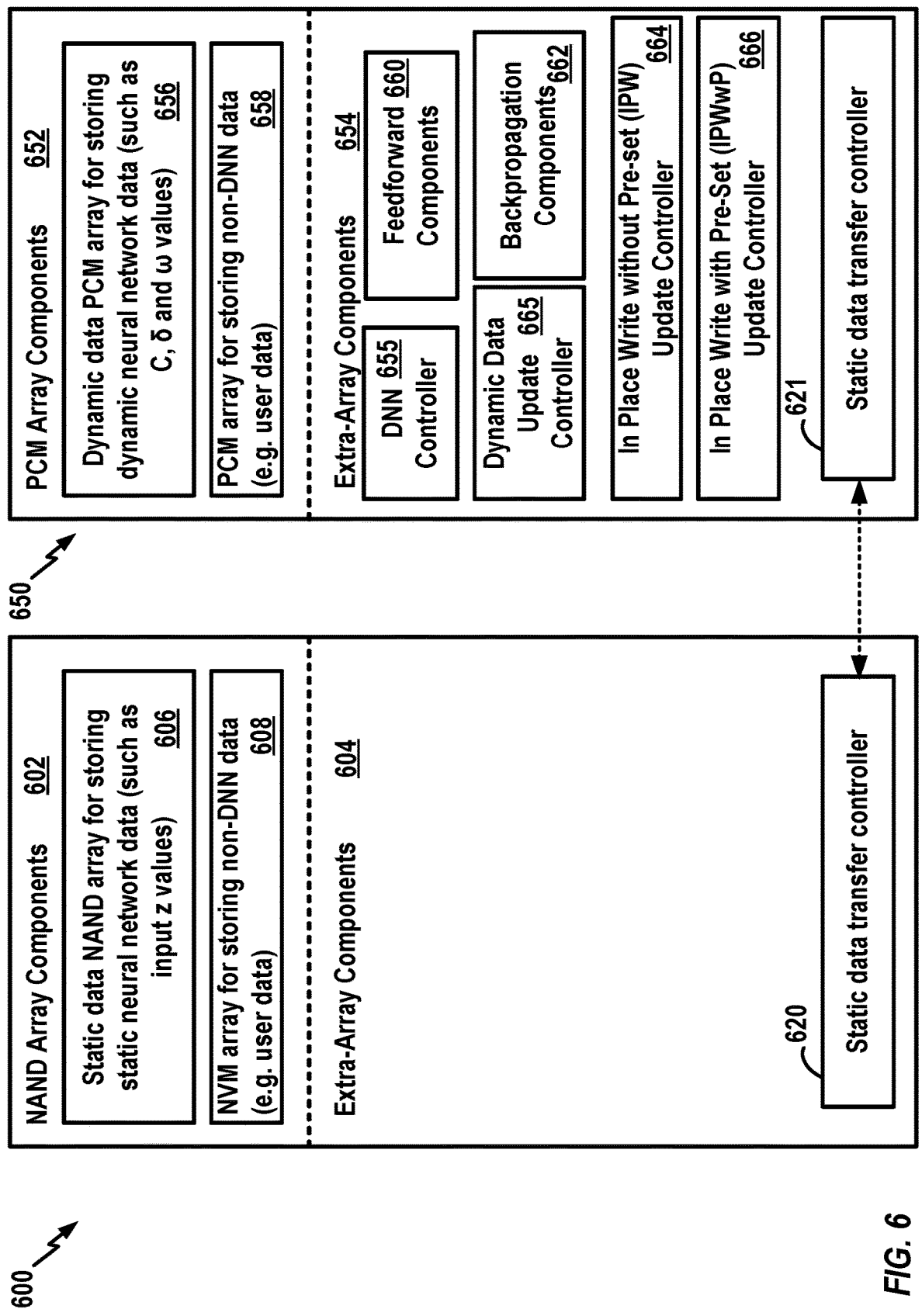
FIG. 6 illustrates exemplary PCM and NAND dies with extra-array components configured to generate and store dynamic neural network data within the PCM die and store static neural network data in the NAND die.

FIGS. 1-6 provide block diagrams of various illustrative embodiments. Briefly, FIGS. 1-2 illustrate an embodiment where a controller of a DSD performs deep learning computations and stores static data in a NAND array on a NAND die and stores dynamic data in a PCM array on a PCM die. Alternatively, a single die may include both NAND arrays and PCM arrays. FIGS. 3-4 illustrate an embodiment where a single die with NAND and PCM arrays performs on-chip deep learning computations using extra-array circuitry in die. The static data is stored within the NAND array of the die and the dynamic data is stored in the PCM array of the die. The overall deep learning procedure is controlled by the controller of the DSD. FIGS. 5-6 illustrate an embodiment where a PCM array in a PCM die performs on-chip deep learning computations using extra-array circuitry in a PCM die. The dynamic data is stored in the PCM array. The static data is maintained within the NAND array of a separate NAND die. The overall deep learning procedure can again be controlled by the controller of the DSD. Again, a single die may include both NAND arrays and PCM arrays. In still other examples, other forms of SCM may be used instead of or in addition to the PCM array.

FIG. 1 is a block diagram of a system 100 including an exemplary SSD or DSD or any memory/processing device having a PCM array for storing dynamic neural network data and a NAND-based array for storing static neural network data in accordance with aspects of the disclosure. The system 100 includes a host 102 and a SSD 104 (or other DSD, but for simplicity referred to as SSD below) coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples. Additionally, or alternatively, the host 102 may be a system or device having a need for neural network processing, such as speech recognition, computer vision, and self-driving vehicles. For example, the host 102 may be a component of a self-driving system of a vehicle or a component of an Internet-of-Things (IoT) device.

The SSD 104 includes a host interface 106, a controller 108, a working memory 110 (such as DRAM or other volatile memory), a NAND interface 112 (which may be referred to as a flash interface), and a NAND array 114, such as one or more NAND dies. The SSD 104 also includes a PCM interface 116, and a PCM array 118, such as one or more PCM dies. Alternatively, individual dies may include both NAND and PCM arrays. The host interface 106 is coupled to the controller 108 and facilitates communication between the host 102 and the controller 108. The controller 108 is coupled to the working memory 110 as well as to the NAND array 114 and the PCM array 118. The host interface 106 may be any suitable communication interface, such as a Non-Volatile Memory Express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In other embodiments, the host interface may be a proprietary interface, a memory interface or a fabric interface. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

The controller 108 controls operation of the SSD 104. In various aspects, the controller 108 receives commands from the host 102 through the host interface 106 and performs the commands to transfer data between the host 102 and the NAND array 114 or the PCM array 118. Furthermore, the controller 108 may manage reading from and writing to working memory 110 for performing the various functions effected by the controller and to maintain and manage cached information stored in the working memory 110. The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The working memory 110 may be any suitable memory, computing device, or system capable of storing data. For example, the working memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the working memory 110, or a portion thereof, to store data during the transfer of data between the host 102 and the NAND array 114. For example, the working memory 110 or a portion of the memory 110 may be a cache memory. In some embodiments, working memory 110 may be replaced by a non-volatile memory such as MRAM, PCM, ReRAM, etc. to serve as a working memory for the overall device. For example, rather than providing both a working memory 110 and a separate PCM array 118, the PCM array 118 might serve as the working memory. In the example of FIG. 1, the controller 108 may include hardware, firmware, software, or any combinations thereof that provide a deep learning neural network controller 120 (or other multidimensional computation procedure controller) for use with the NAND array 114 and PCM array 118.

Although FIG. 1 shows an example SSD and an SSD is generally used as an illustrative example in the description throughout, the various disclosed embodiments are not necessarily limited to an SSD application/implementation. As an example, the disclosed NVM array die(s) and associated processing components can be implemented as part of a package that includes other processing circuitry and/or components. For example, a processor may include, or otherwise be coupled with, embedded NVM and associated circuitry and/or components for deep learning that are described herein. The processor could, as one example, off-load certain machine learning tasks to the NVM dies (as will be described below) and associated circuitry and/or components. As another example, the controller 108 may be a controller in another type of device and still include the neural network controller 120 and perform some or all of the functions described herein.

FIG. 2 illustrates a block diagram of an exemplary PCM die 200 that includes PCM storage array components 202 and under-the-array or next-to-the-array (or other extra-array) processing components 204. (This assumes that separate PCM and NAND dies are provided. In other examples, discussed below, a single die may include PCM and NAND arrays. Note also that not all circuits or memory components used in a practical PCM die are illustrated, such as voltage regulation components, clock and timing components, etc. Rather only some illustrative components and circuits are shown, summarized as blocks or schematics.) The PCM storage array components 202 of FIG. 2 include a dynamic data PCM array 206 for storing dynamic neural network data (such as C, $\delta$ and $\omega$ values) received from the controller 120 of FIG. 1 and a non-DNN array 208 for storing non-DNN data (e.g. other types of data such as user data). Stored C, $\delta$ and $\omega$ values may be read from the dynamic data array 206 and transferred back to the controller 120. In this manner, the controller 120 may use the PCM die 200 as a working memory during neural network computations for storing dynamic data.

The extra-array processing components 204 include an In Place Write without Pre-set (IPW) Update controller 210 and an In Place Write with Pre-set (IPWwP) Update controller 212, which control the updating of the dynamic data stored in dynamic data PCM array 206 based on data and commands received from computation components of the controller 120 of FIG. 1. In some examples, the dynamic data to be updated are synaptic weights computed during the backpropagation stage of a DNN training procedure.

The IPW controller 210 is configured to update data within the dynamic data PCM array 206 by updating only particular bits of the stored data that need updating by selectively performing a set of individual bit-addressable writes within the stored data. As discussed above, a IPW may include changing selected bits from the first memory state to the second memory state (using RESET pulses) and changing other selected bits from the second memory state to the first memory state (using SET pulse). This may be part of a RMW. The IPWwP controller 212 is configured to update data within the dynamic data PCM array 206 by pre-setting a portion of the dynamic data PCM array 206 to the first memory state and then updating only particular bits within the pre-set portion to the second memory state to encode the updated data. IPWwP may include (a) pre-setting or initializing all bit states of the data to be updated to the first memory state (e.g. 1) using SET pules, then changing selected bits within the data to the second state (e.g. 0) using RESET pulses to encode the updated data into the array, without changing any of the bits of pre-set data from the second state to the first state. As noted above, within PCM, SET pulses are relatively slow and RESET pulses are relatively fast, but individual RESET pulses consume more power than individual SET pulses. Hence, in some cases, depending upon the number of bits that need to be flipped to updated data, an IPWwP may be preferred. In other cases, the IPW may be preferred.

Referring again to FIG. 1, the deep learning neural network controller 120 may be configured to determine an amount of data that will need to be updated within the PCM array following an iteration of a neural network procedure. The neural network controller 120 then determines whether the PCM array should update the data using IPW or IPWwP. The determination may be made based on a prediction or an estimation of the amount of data to be updated. The prediction may be based, for example, on a function derived from a learning rate and other neural network parameters. Note that the rate of change of synaptic weights is strongly affected by the learning rate. (The learning rate is a parameter of the neural network training that indicates how quickly the weights change from iteration to iteration.) The mathematics of synaptic weight calculations in a DLA are such that the weights change much more during the first phases of iterations but change less as the iterations advance and the network training converges to a final result (some maxima or minima). Moreover, as the number of calculations per iteration is usually fixed, the timing of each synaptic weight update is periodic, thus allowing the device to estimate or predict the rate (or amount) of change in weights in advance from one iteration to the next.

In one example, the neural network controller 120 compares the expected amount of change to a predetermined threshold. If the expected amount is below the threshold, IPW is preferred because it will likely consume less power (since relatively few pulses of either type, SET or RESET, are needed). If the number is at or above the threshold, IPWwP is instead preferred since (a) it will likely be much faster (with the bits pre-set before the data is actually available so that the actual bit writes can all be performed using fast RESET pulses) and (b) no significant power savings are likely to be achieved via the IPW since many bits need to be flipped. In this manner, the expected amount of data to be updated is used a proxy by the deep learning neural network controller 120 for the amount of power expected to be consumed during the update process, so that the deep learning neural network controller 120 can be reduce or minimize power consumption by selecting between IPW and IPWwP.

The deep learning neural network controller 120 may also include regularization components that selectively disable the updating of at least some of the dynamic values in the PCM array to prevent or remedy overfitting to regularize the DNN to escape from local minima and converge to global minima or maxima in the DNN. For example, if the expected amount of change is below some regularization threshold, then updates may be disabled until the amount of change again exceeds the regularization threshold in a subsequent iteration of the procedure. Note that the regularization threshold, if used, may be different than the threshold used to choose between IPW and IPWwP.

In some examples, the deep learning neural network controller 120 sends a signal to the PCM array 200 indicating whether IPW or IPWwP is to be performed during the next update of dynamic DNN data (e.g. during a next backpropagation stage). If IPW is selected, the PCM array 200 waits until the updated data is received for the neural network controller 120 and then performs the IPW. If IPWwP is selected, the PCM array 200 promptly performs a SET operation to pre-set the data to be updated to the SET state using SET pulses.

FIG. 3 is a block diagram of another system 300 including an exemplary SSD or DSD or any memory/processing device having an NVM die with a PCM array for storing dynamic neural network data and a NAND array for storing static neural network data in accordance with aspects of the disclosure. In this example, the neural network data is generated within the NVM die using extra-array processing components. As many of the features of the overall DSD may be the same as the DSD of FIG. 1, the similar features will not be described again in detail.

Briefly, the system 300 includes a host 302 and a SSD 304 or other DSD. The SSD 304 includes a host interface 306, a controller 308, a working memory 310, an NVM interface 312, an NVM die 313, which includes a NAND array 314 and a PCM array 318. In the example of FIG. 3, the controller 308 may include hardware, firmware, software, or any combinations thereof that provide a deep learning neural network controller 320 (or other multidimensional computation procedure controller) for use with the NVM die 313.

FIG. 4 illustrates a block diagram of an exemplary NVM die 400 that includes NAND storage array components 402, PCM array components 452, and under-the-array or next-to-the-array (or other extra-array) processing components 404 including a DNN controller 405. (Note that not all circuits or memory components used in a practical NVM die are illustrated, such as voltage regulation components, clock and timing components, etc.) The NAND array components 402 include a static data NVM array 406 configured for storing static neural network data (such as input z values) under the control of a static data storage controller 420. One or more additional NAND arrays 408 store other (non-DD) data such as user data or other non-neural network data. The PCM array components 452 of the NVM die 400 include a dynamic data PCM array 456 configured for storing dynamic neural network data (such as C and δ and ω values) under the control of a dynamic data storage controller 422. One or more additional PCM arrays 458 may store non-DNN data such as user data or other non-neural network data.

In the example of FIG. 4, the extra-array processing components 404 of NAND die 400 additionally include: the DNN controller 405 for controlling and managing all DNN operations on the NAND die 400; an input component 409 for receiving and storing input data (such as input neural network data for storage in the static NVM array 406); feedforward components 410 configured to perform feedforward neural network operations, such as computing values in accordance with Equation 1; and backpropagation components 412 configured to perform backpropagation neural network operations, such as to compute values in accordance with Equations 5-8, such as C, δ and ω values that may be obtained via backpropagation from input static z values obtained from static data NVM array 406. The extra-array processing components 454 also include an IPW update controller 464 and an IPWwP update controller 466, which perform the updating of the dynamic data stored in dynamic data PCM array 456. The IPW controller 464 and the IPWwP controller 466 may operate as described above in connection with FIG. 2 and hence will not be described in detail again.

As noted, the C, δ and ω values may be stored (updated) in the PCM dynamic data array 456. In this manner, the NVM die 400 may use the PCM array 452 as a working memory during neural network computations for storing dynamic data. The extra-array processing components 404 also includes a dynamic data update controller 415 that estimates or predicts the amount of data to be updated within the PCM array 452 and determines whether the update should be done using IPW or IPWwP. Although not shown, regularization components may also be provided that selectively disable the updating of at least some of the dynamic values to prevent or remedy overfitting within a DNN to regularize the DNN.

Although not shown in FIG. 4, the feedforward components 410 may include: multiplication circuits configured to compute the products of synaptic weights and activation values (as in, e.g., Equation 1); summation circuits configured to sum such products (as in, e.g., Equation 1); bias addition circuits configured to add bias values to the sums (as in, e.g., Equation 1); and RLU/sigmoid function circuits configured to compute RLU or sigmoid functions of the resulting values (as in, e.g., Equation 1). A plurality of each of feedforward circuits may be configured to operate in parallel, e.g., N separate parallel feedforward circuits may be provided for each of the N layers of a neural network.

The backpropagation components 412 are configured to perform backpropagation neural network operations, such as to compute values in accordance with Equations 5-8, above, such as C, $\delta$ and $\omega$ values that may be obtained via backpropagation from input static z values obtained from static data NVM array 406. The dynamic values generated by the backpropagation components 412 (e.g. C, $\delta$ and $\omega$ values) are stored in dynamic data PCM arrays 456. Although not shown in FIG. 4, the backpropagation components 412 may include: weight update determination circuits configured to compute updates to the synaptic weights (as in, e.g., Equations 5-8) for storage in dynamic data PCM arrays 456. A plurality of backpropagation circuits may be configured to operate in parallel, e.g., N separate parallel backpropagation circuits may be provided for each of the N layers of a neural network.

The feedforward operations and backpropagation operations may be performed iteratively or sequentially using the various weight and bias values of a neural network stored in the PCM die 450, as well as activation values or training values input from a controller. Once a full series of neural network computations has been completed, such as a full set of feedforward computations to generate a final output result, or a full set of backpropagation computations to update the synaptic weights, a suitable notification signal or indicator value may be sent to the controller.

FIG. 5 is a block diagram of yet another system 500 including an exemplary SSD or DSD or any memory/processing device having a PCM die for storing dynamic neural network data and a NAND die for storing static neural network data in accordance with aspects of the disclosure. In this example, the neural network data is generated within the PCM die using extra-array processing components using static data obtained from the NAND die 514. As many of the features of the overall DSD may be the same as the DSDs of FIGS. 1 and 3, the similar features will not be described again in detail.

Briefly, the system 500 includes a host 502 and a SSD 504 or other DSD. The SSD 504 includes a host interface 506, a controller 508, a working memory 510, a NAND interface 512, a NAND die 514, a PCM interface 516, and a PCM die 518. In the example of FIG. 5, the controller 508 may include hardware, firmware, software, or any combinations thereof that provide a deep learning neural network controller 520 (or other multidimensional computation procedure controller) for use with a NAND-based array 514 and the PCM array 518. Note that static data may be routed between the NAND die 514 and the PCM die 518 via respective interface components 512 and 516 and the controller 508.

FIG. 6 illustrates a block diagram of an exemplary NAND die 600 that includes NAND storage array components 602 and extra-array processing components 604 including a static data NVM array 606 configured for storing static neural network data (such as input z values). One or more additional NAND arrays 608 store other data such as user data or other non-neural network data. FIG. 6 also illustrates a block diagram of an exemplary PCM die 650 that includes PCM storage array components 652 and under-the-array or next-to-the-array (or other extra-array) processing components 654. The PCM array components 652 include a dynamic data PCM array 656 configured for storing dynamic neural network data (such as C and $\delta$ and $\omega$ values). One or more additional PCM arrays 658 store non-DNN data such as user data or other non-neural network data.

In the example of FIG. 6, the extra-array processing components 654 of PCM die 652 include: the DNN controller 655 for controlling and managing all DNN operations on the PCM die 650; feedforward components 660 configured to perform feedforward neural network operations, such as computing values in accordance with Equation 1; and backpropagation components 662 configured to perform backpropagation neural network operations, such as to compute values in accordance with Equations 5-8, such as C, $\delta$ and $\omega$ values that may be obtained via backpropagation from input static z values obtained from static data NAND array 606 via static data transfer controllers 620 and 621. The C, $\delta$ and $\omega$ values may be stored (updated) in the dynamic data array 656 of the PCM die 650 and the stored values may be read from the dynamic data array 656 of the PCM die 650 further processing. Static data may be maintained in the static data array 606 of the NAND die 600. In this manner, the PCM die 650 may use the NAND die 600 as a static data memory during neural network computations. The feedforward components 610 and the backpropagation components 612 may be configured as discussed above.

The extra-array processing components 654 also includes a dynamic data update controller 665 that estimates or predicts the amount of data to be updated within the PCM array 656 and determines whether to update the data using IPW or IPWwP. The extra-array processing components 654 also include an IPW controller 664 and an IPWwP update controller 666, which control the updating of the dynamic data stored in dynamic data PCM array 656 based on data and commands received from DNN controller 655. The IPW controller 664 and the IPWwP controller 666 may operate as described above in connection with FIG. 2 and hence will not be described in detail again. Although not shown in FIG. 6, the extra-array processing components 604 may also include regularization components that selectively disable the updating of at least some of the dynamic values to regularize the DNN to escape from local minima and converge to global minima or maxima in the DNN.

Figure 7:
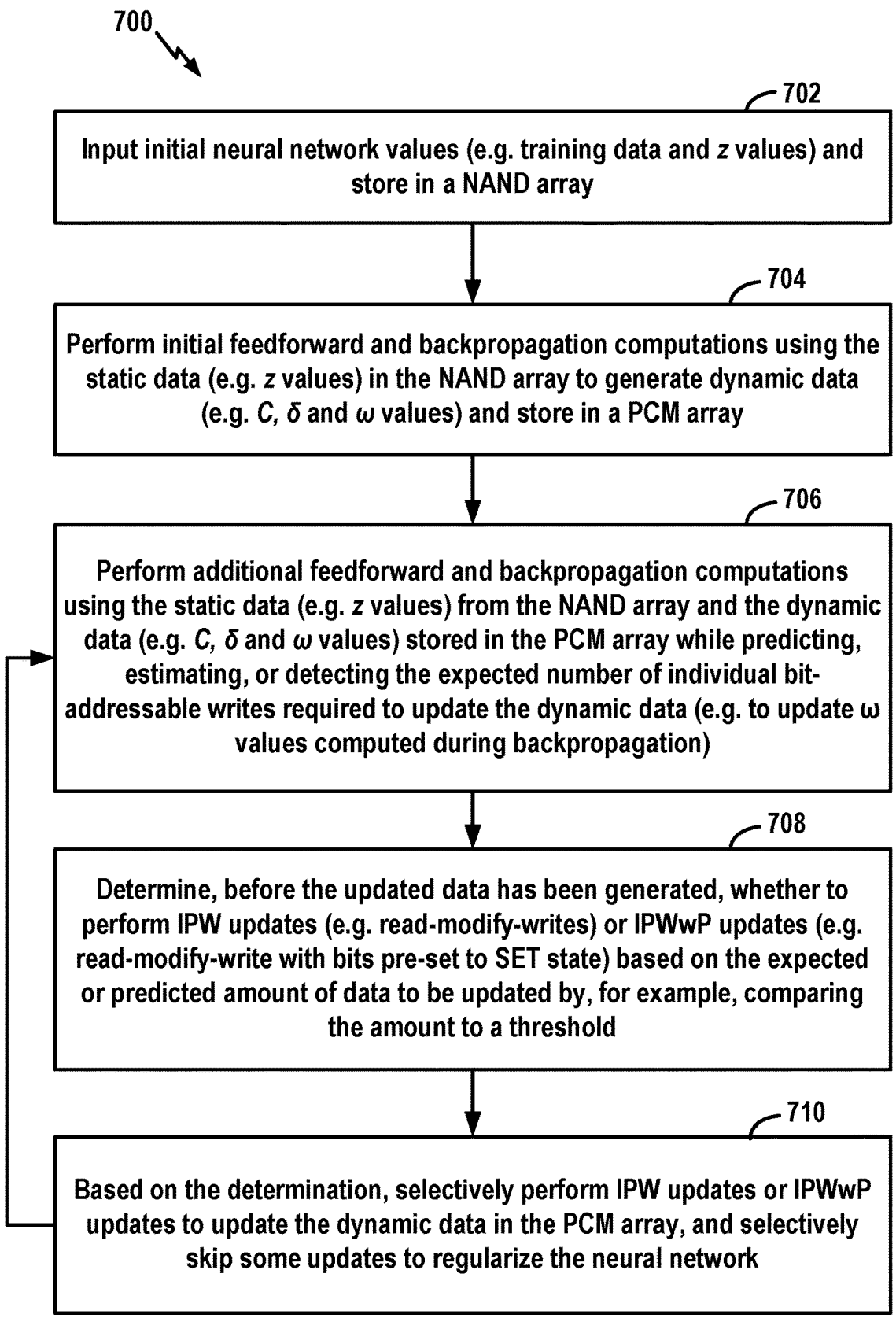
FIG. 7 illustrates a flow chart of an exemplary method for performing neural network operations and controlling updates of dynamic neural network data within a PCM array using place bit-addressable writes.

FIG. 7 illustrates procedures 700 that may be performed by the DSD systems of FIGS. 1-6 or other suitably equipped systems to performing neural network processing while selectively controlling IPW or IPWwP dynamic data updates. Depending upon the particular system, at least some of the operations may be performed by extra-array processing components of an NVM die having both NAND arrays and PCM arrays. Beginning at block 702, the DSD inputs initial neural network values (e.g. training data and z values) and stores the initial data in a NAND array. The initial data may be provided by a host that the DSD is coupled to or in communication with. At block 704, the DSD performs initial feedforward and/or backpropagation computations using the static data (e.g. z values) in the NAND array to generate dynamic data (e.g. C, δ and ω values) and store in a PCM array.

At block 706, the DSD performs additional feedforward and backpropagation computations using the static data (e.g. z values) from the NAND array and the dynamic data (e.g. C, δ and ω values) stored in the PCM array while predicting, estimating, or detecting the expected amount of dynamic data to be updated. For example, based on a current round or stage of an iterative neural network procedure, the DSD may estimate the expected amount of data to be updated (e.g. the expected amount of ω values that will change during the next round of backpropagation) in the next iteration of the overall procedure. Exemplary procedures for estimating the expected amount of data to be updated are discussed below.

At block 708, the DSD determines (before the updated data has been generated) whether to perform IPW updates (e.g. read-modify-writes where some bits are SET and other bits are RESET) or IPWwP updates (e.g. read-modify-writes where all bits are preset to the SET state so that selected bits can then be changed with a fast RESET) where the determination is based on the expected or predicted amount of data to be updated by, for example, comparing the amount to a threshold. As noted above, in some examples, if the amount is below the threshold, the IPW is performed on the stored dynamic data in the PCM array. Otherwise, the IPWwP is performed on the stored dynamic data in the PCM array.

At block 710, based on the determination, the DSD selectively performs IPW or IPWwP to update the dynamic data in the PCM array. Note that the preset stage of the IPWwP update may be performed before the updated data is sent to the PCM array so that, by the time the data is received, the bits have been SET so that the update then may be completed using only fast RESET pulses. In this manner, update latency may be reduced by predicting the amount of data to be updated and applying the SET pulses in advance so that, once the updated data is available, the update can be completed quickly.

Moreover, at block 710, the DSD may selectively skip some updates (or portions of updates) to regularize the neural network. For example, the DSD may be configured to skip some selected portion of every nth update of the synaptic weights to help avoid or prevent overfitting, such as by skipping one half of every 10th update. That is, in the example, only half of the synaptic weights set for update are actually updated within the PCM array, so that during a next iteration of the procedure, the DSD will use some updated values and some non-updated values. In general, during any particular iteration, the DSD may select some percentage (x %) of the data to skip during updates (wherein 0%<x<100%).

Following block 710, processing returns to block 706 for additional feedforward and/or backpropagation computations. The operations of blocks 706, 708, and 710 may be repeated until the neural network processing procedure is complete. In examples where the procedure is performed to train a DNN, the procedure may be deemed complete once the DNN has been trained (as determined using some training completion detection criteria).

Figure 8:
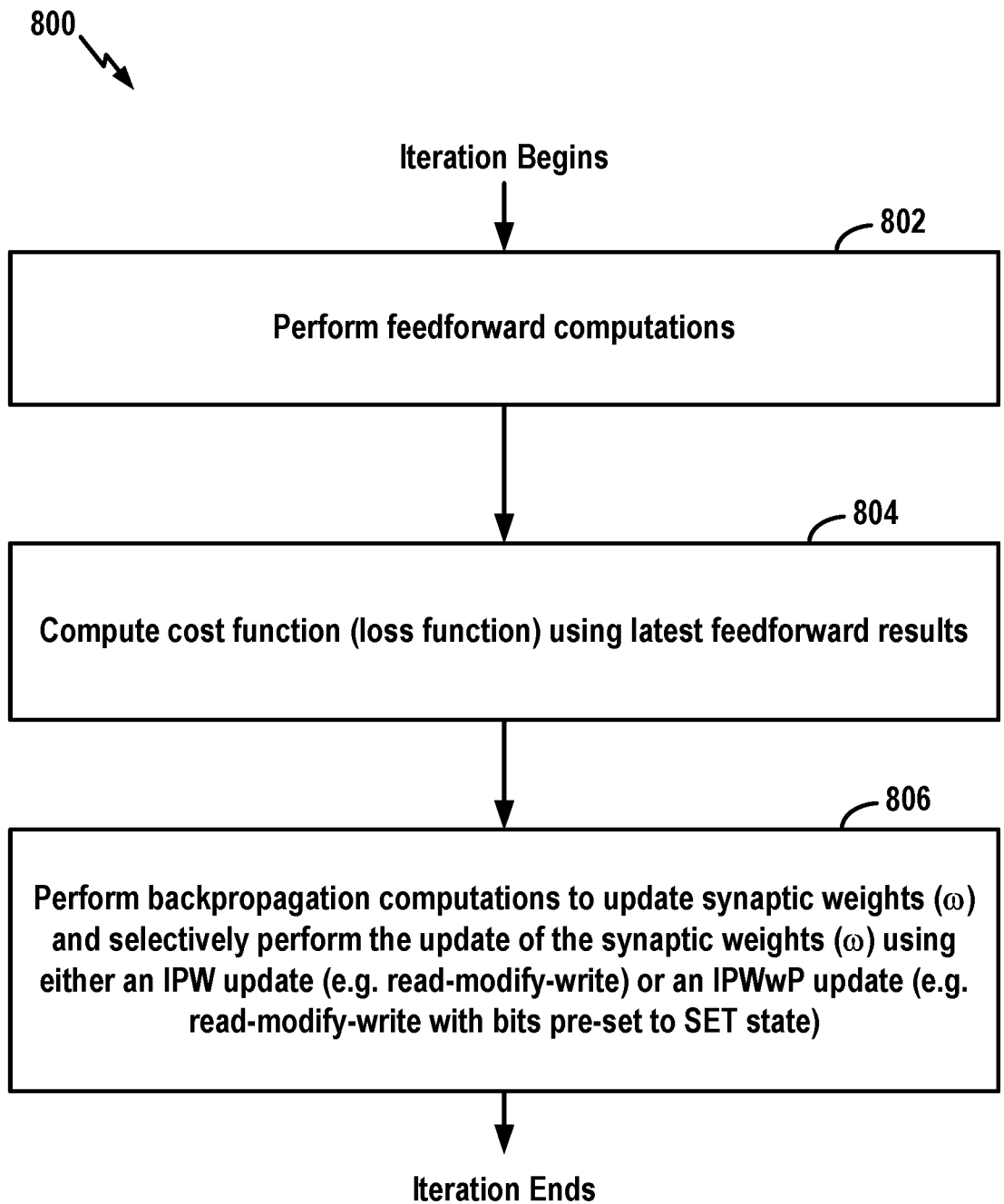
FIG. 8 illustrates a flow chart of an exemplary method for performing one iteration of a neural network training procedure.

FIG. 8 illustrates procedures 800 that may be performed during one iteration of a neural network training procedure by the DSD of FIGS. 1-6 or by other suitably equipped systems to performing neural network processing. Depending upon the particular system, at least some of the operations may be performed by extra-array processing components of an NVM die having both NAND arrays and PCM arrays. At block 802, upon beginning an iteration of the procedure, the DSD performs feedforward computations using the static data and the latest versions of the dynamic data. See, for example, Equation 1, above. At block 804, the DSD computes the cost function (also called a loss function, which may be a value or vector or values). See, for example, Equation 2, above. At block 806, the DSD performs backpropagation computations to update synaptic weights (ω) and selectively performs the update of the synaptic weights (ω) using either an IPW update (e.g. read-modify-write where some bits are SET and other bits are RESET) or an IPWwP update (e.g. read-modify-write where all bits are preset to the SET state so that selected bits can then be changed with a fast RESET). (Again, note that the preset stage of the IPWwP update may be performed before updated data is sent to the PCM array to reduce write latency.) For the backpropagation computations see, for example, Equations 5-8, above. Backpropagation may be performed layer by layer, as illustrated in the next figure.

Figure 9:
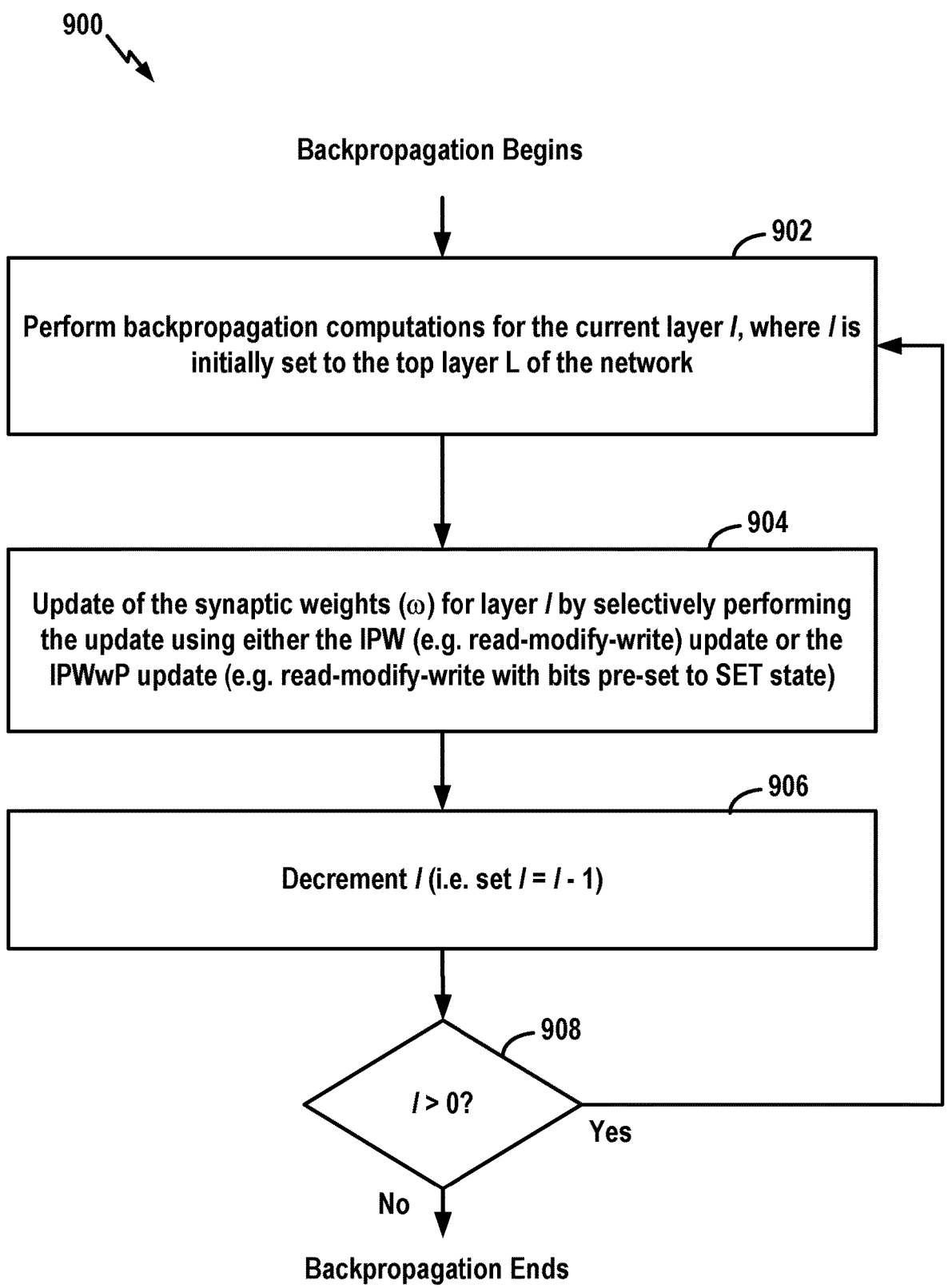
FIG. 9 illustrates a flow chart of an exemplary method for performing a backpropagation procedure.

FIG. 9 illustrates backpropagation procedures 900 that may be performed during one iteration of a neural network training procedure by the DSD of FIGS. 1-6 or by other suitably equipped systems to performing neural network processing. Depending upon the particular system, at least some of the operations may be performed by extra-array processing components of an NVM die having both NAND arrays and PCM arrays. At block 902, upon beginning the backpropagation stage of the current iteration of the procedure, the DSD performs backpropagation computations for the current layer l, where l is a counter that is initially set to the top layer L of the network. So, for example, if there are 100 layers, then L=100 and backpropagation begins with l=L=100. In an example with 1000 layers, backpropagation begins with l=L=1000. The total number of layers (L) can vary considerably from one neural network to another from only few layers to thousands or more. At block 904, the DSD updates of the synaptic weights (ω) for layer l by selectively performing the update using either the IPW update (e.g. read-modify-write) or an IPWwP update (e.g. read-modify-write where all bits are preset to the SET state). (Again, note that the preset stage of the IPWwP update may be performed before updated data is sent to the PCM array to reduce write latency.) At block 906, the DSD decrements the counter l by setting l=l−1. At decision block 908, the DSD determines whether there are any further layers to process and, if so, processing returns to block 902 to process the next layer using the decremented value of the counter l.

Figure 10:
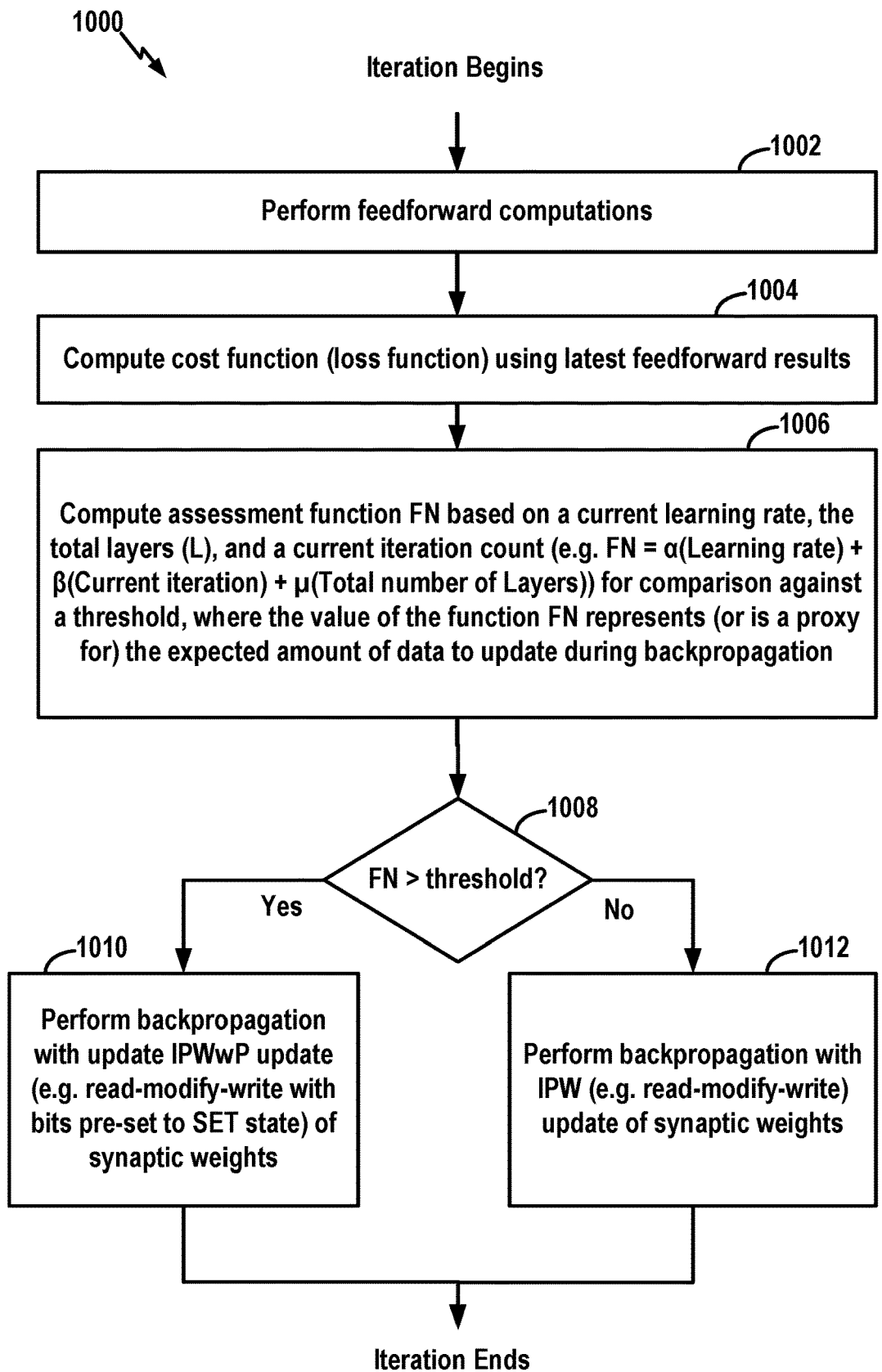
FIG. 10 illustrates a flow chart of an exemplary method for performing one iteration of a neural network training procedure in which different backpropagation/update procedures are selected depending upon an amount of data to be updated estimated based, in part, on a current learning rate of the training procedure.

FIG. 10 illustrates additional procedures 1000 that may be performed during one iteration of a neural network training procedure by the DSD of FIGS. 1-6 or by other suitably equipped systems to performing neural network processing. Depending upon the particular system, at least some of the operations may be performed by extra-array processing components of an NVM die having NAND arrays and PCM arrays. At block 1002, upon beginning an iteration of the procedure, the DSD performs feedforward computations using the static data and the latest versions of the dynamic data. At block 1004, the DSD computes the cost function (loss function).

At block 1006, the DSD computes an assessment function FN based on a current learning rate, the total number of layers (L), and a current iteration count for comparison against threshold, where the value of the function FN represents the expected amount of data to update during backpropagation. Note that the learning rate (often denoted η or α) is a tuning parameter in neural network optimization computations that determines the step size at each iteration while moving toward a minimum of a loss function. When training neural networks, the learning rate may be a configurable hyperparameter (often set to a small positive value, e.g. in the range between 0.0 and 1.0.). Hence, the DSD may use whatever value is currently specified within its DLA for the learning rate.

In an illustrative example:

$$FN=\alpha(\text{Learning rate})+\beta(\text{Current iteration})+\mu(\text{Total number of Layers}).$$

Note that, in this example, FN represents the current rate of change of synaptic weights in the neural network. That is, in this example, the current rate of change is used as a proxy for the amount of change in the data to be updated. The greater the current rate of change, the greater the amount of data to update. The lower the current rate of change, the smaller the amount of data to update. With suitable weighting of the parameters α, β, and μ, an FN value is thereby generated that predicts or estimates the level of change of the synaptic weights during a next backpropagation stage of processing. As noted above, the expected amount of change in the data can be proxy for the amount of power expected to be consumed during an update. Hence, FN can also serve as a proxy for power consumption.

Suitable values for the parameters α, β, and μ may be determined in advance through otherwise standard machine learning analysis. These values may depend on the particular DNN (e.g. speech recognition DNN vs. image recognition DNN). A suitable value for the corresponding threshold may be determined in advance by observing test systems to identify a threshold value that serves to reduce or minimize some desired operational parameter, such as power consumed by the updates. For example, the amount of power consumed during synaptic weight updates with the particular type of PCM array to be used in a deployed system may be measured in advance while running test DLA systems and while using different test thresholds. Based on the power consumed when using particular test thresholds in test systems, an optimal or preferred threshold may be identified that reduces power consumption during synaptic weight updates (at least on the average). The identified threshold value may be programmed into DLAs that incorporate the particular type of PCM array. As can be appreciated, power consumption may vary from one PCM array architecture to another and may vary from one DLA design to another and may vary depending upon the particular DNN (e.g. speech recognition DNN vs. image recognition DNN). Hence, different thresholds may be appropriate for different embodiments and for different applications.

In other examples, other functions FN may be used that quantify the expected amount of change in the data based on other parameters, such as by estimating the number of bits that are expected to change within portions of data representing the synaptic weights for comparison against a suitable threshold that is also representative of a number of bits. Hence, an FN that represents the current rate of change of the DNN is just one example of an FN.

At decision block 1008, the DSD compares the computed values of the function FN against the programmed threshold to determine whether backpropagation should be performed while updating the synaptic weights using IPW or IPWwP.

If the value of the function FN exceeds the threshold, then the operations of block 1010 are performed where backpropagation is performed with IPWwP to update synaptic weights. See, for example, the backpropagation procedure of FIG. 9, particularly block 904, in which synaptic weights are updated. When backpropagation is performed in accordance with block 1010 of FIG. 10, the IPWwP is used in block 904 of FIG. 9. If the value of the function FN does not exceed the threshold, the operations of block 1012 are performed where backpropagation is performed with one-pass update of synaptic weights. See, again, the backpropagation procedure of FIG. 9, particularly block 904. If backpropagation is performed in accordance with block 1020 of FIG. 10, the IPW is used in block 904 of FIG. 9.

Although FIG. 10 illustrates an example with one threshold value, additional thresholds may be employed to further control updates. For example, various types of IPWwP updates may be implanted that preset various portions of data buffers to be updated or which selectively disable updates to, for example, trigger various amounts of regularization of the DNN. Note also that the determination of the expected amount of change need not be performed each iteration but may be performed, for example, every nth iteration, where n is programmable. If the determination is not made each iteration, the device may be configured to continue to use the most recent update choice. That is, if the last determination resulted in the device choosing IPWwP, then the device will continue to use IPWwP until another determination is made that instead chooses IPW.

Figure 11:
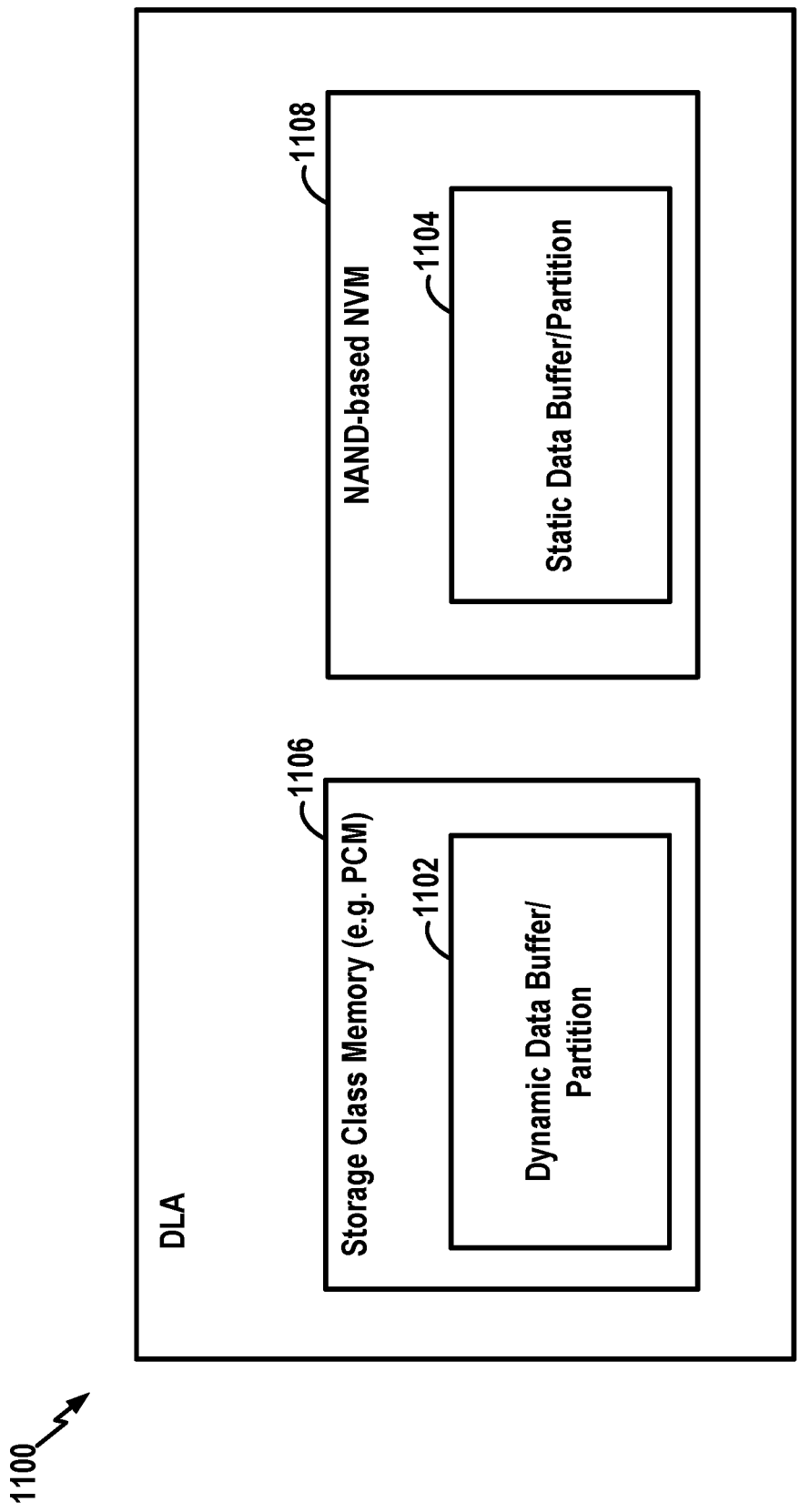
FIG. 11 illustrates an example of a DLA device having a dynamic data buffer within an SCM and having a separate static data buffer within a NAND-based NVM.

FIG. 11 illustrates a DLA 1100 having a separate dynamic data buffer (or partition) 1102 and a static data buffer 1104 (or partition). The dynamic data buffer is 1102 is a portion of a SCM 1106, such as a PCM array. The static data buffer is 1104 is a portion of a NAND-based NVM 1108. In some examples, the PCM array and the NAND arrays are formed on the same die. In other examples, they may be formed on separate dies. An example of a DLA is one of the DNN systems and circuits discussed above, such as those described with reference to FIGS. 1-6. An example of a dynamic data buffer within an SCM is one or more of the dynamic data PCM arrays discussed above. An example of a static data buffer is one or more of the static data NAND arrays discussed above. However, other devices and apparatus may form the DLA 1100, the dynamic data buffer 1102, the static data buffer 1104, and the SCM 1106. FIG. 11 is provided, at least in part, to illustrate and emphasize the general applicability of features described herein to other systems besides those shown in FIGS. 1-6.

In the following, various general exemplary procedures and systems are described.

Additional Exemplary Procedures and Apparatus

Figure 12:
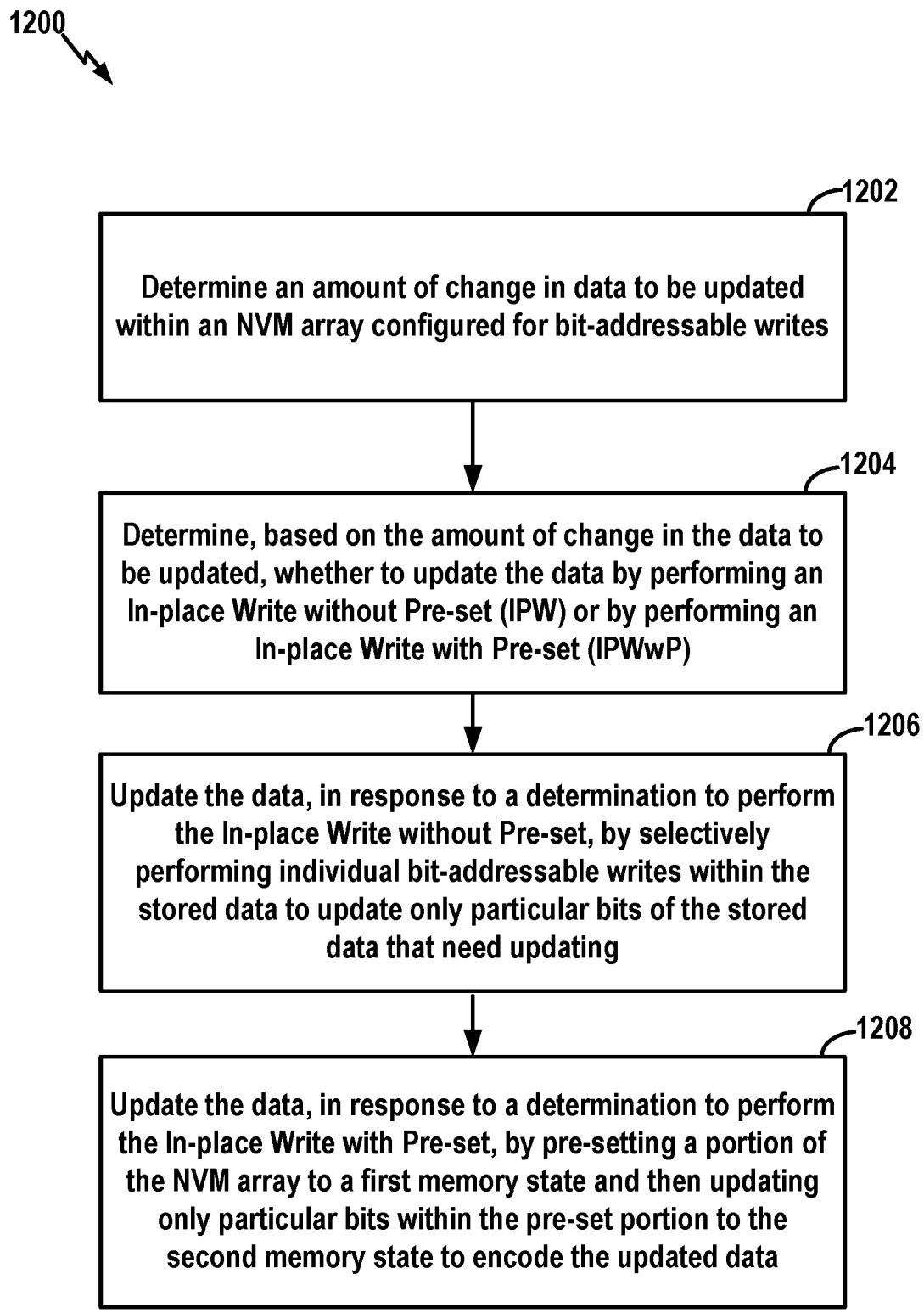
FIG. 12 illustrates a flow chart that summarizes exemplary operations performed by a storage device having an NVM array configured for bit-addressable writes.

FIG. 12 illustrates a process 1200 in accordance with some aspects of the disclosure. The process 1200 may take place within any suitable apparatus or device capable of performing the operations, such as a DSD with SCM. At block 1202, the apparatus determines an amount of change in data to be updated within an NVM array configured for bit-addressable writes. At block 1204, the apparatus determines, based on the amount of change in the data to be updated, whether to update the data by performing an IPW (e.g. a RMW) or performing an IPWwP (e.g. read-modify-write where all bits are preset to the SET state). At block 1206, the apparatus updates the data, in response to a determination to perform the IPW, by selectively performing individual bit-addressable writes within the stored data to update only particular bits of the stored data that need updating. At block 1208, the apparatus updates the data, in response to a determination to perform the IPWwP, by pre-setting a portion of the NVM array to a first memory state and then updating only particular bits within the pre-set portion to the second memory state to encode the updated data.

Figure 13:
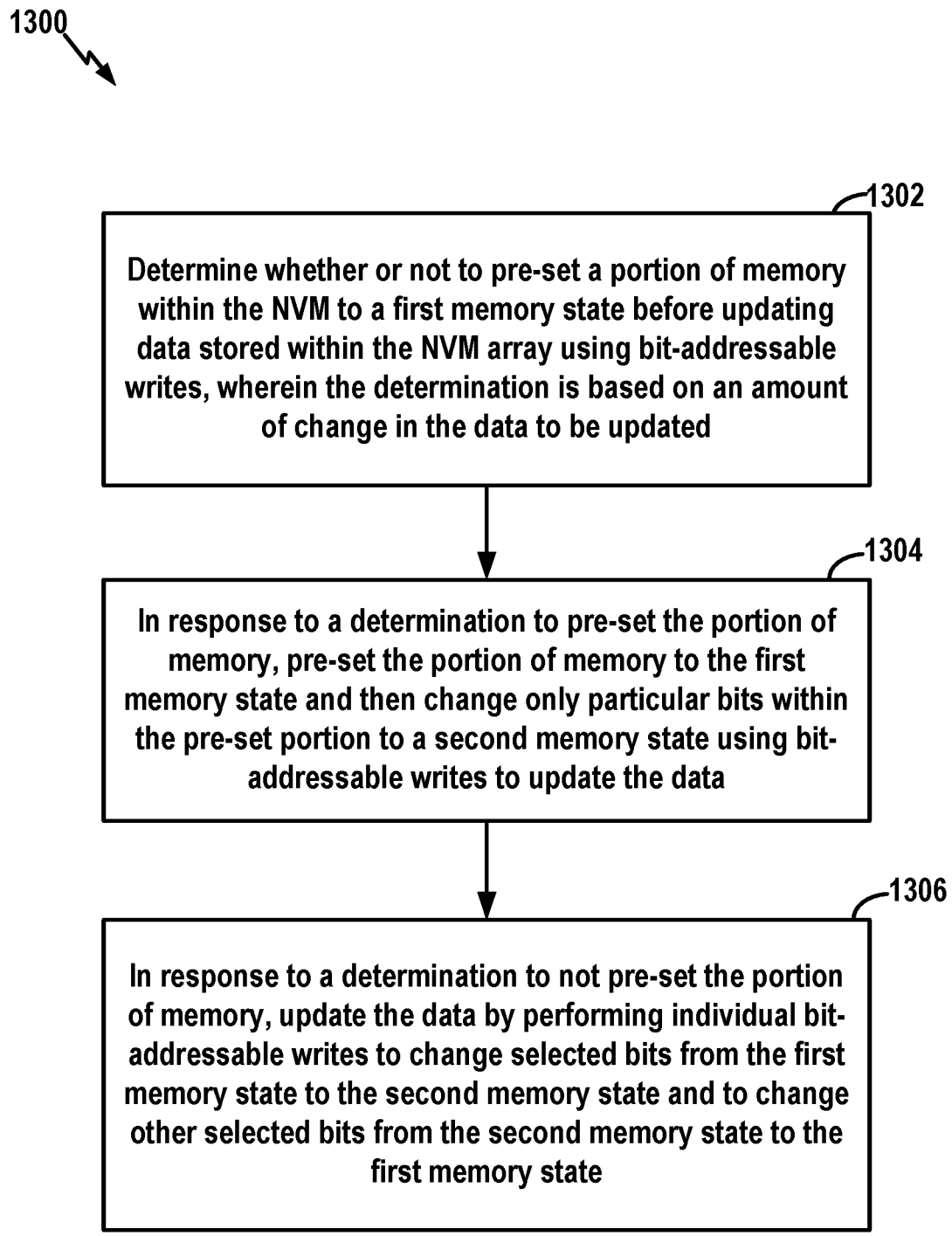
FIG. 13 illustrates a flow chart that summarizes other exemplary operations performed by a storage device having an NVM array configured for bit-addressable writes.

FIG. 13 illustrates a process 1300 in accordance with some aspects of the disclosure. The process 1300 may take place within any suitable apparatus or device capable of performing the operations, such as a DSD with SCM. At block 1302, the apparatus determines whether or not to pre-set a portion of memory within the NVM to a first memory state before updating data stored within the NVM array using bit-addressable writes, wherein the determination is based on an amount of change in the data to be updated. At block 1304, in response to a determination to pre-set the portion of memory, the apparatus pre-sets the portion of memory to the first memory state and then changes only particular bits within the pre-set portion to a second memory state using bit-addressable writes to update the data. That is, in some examples, at block 1304 the apparatus performs an IPWwP update. At block 1306, in response to a determination to not pre-set the portion of memory, the apparatus updates the data by performing individual bit-addressable writes to change selected bits from the first memory state to the second memory state and to change other selected bits from the second memory state to the first memory state. That is, in some examples, at block 1306 the apparatus performs an IPW (e.g. a RMW).

Figure 14:
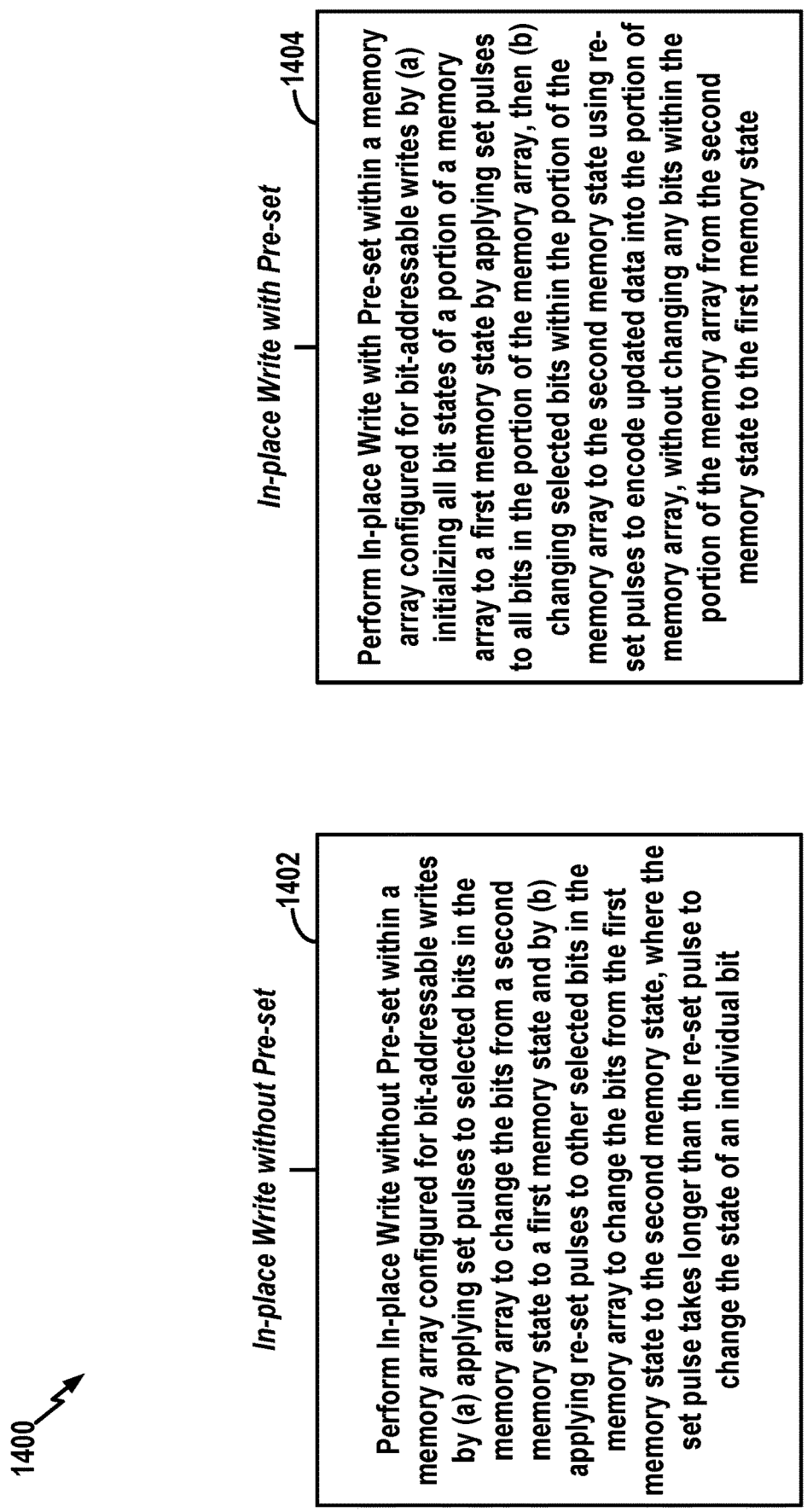
FIG. 14 illustrates a pair of flow charts that contrast In place Writes with Pre-set and In Place Writes without Pre-Set.

FIG. 14 illustrates processes 1400 in accordance with some aspects of the disclosure. The processes may take place within any suitable apparatus or device capable of performing the operations, such as a DSD with SCM. At block 1402, the DSD performs an IPW (e.g. a RMW) within a memory array configured for bit-addressable writes by (a) applying set pulses to selected bits in the memory array to change the bits from a second memory state to a first memory state and by (b) applying re-set pulses to other selected bits in the memory array to change the bits from the first memory state to the second memory state, where the set pulse takes longer than the re-set pulse to change the state of an individual bit. At block 1404, the DSD performs an IPWwP within a memory array configured for bit-addressable writes by (a) initializing all bit states of a portion of a memory array to a first memory state by applying set pulses to all bits in the portion of the memory array, then (b) changing selected bits within the portion of the memory array to the second memory state using reset pulses to encode updated data into the portion of memory array, without changing any bits within the portion of the memory array from the second memory state to the first memory state.

Figure 15:
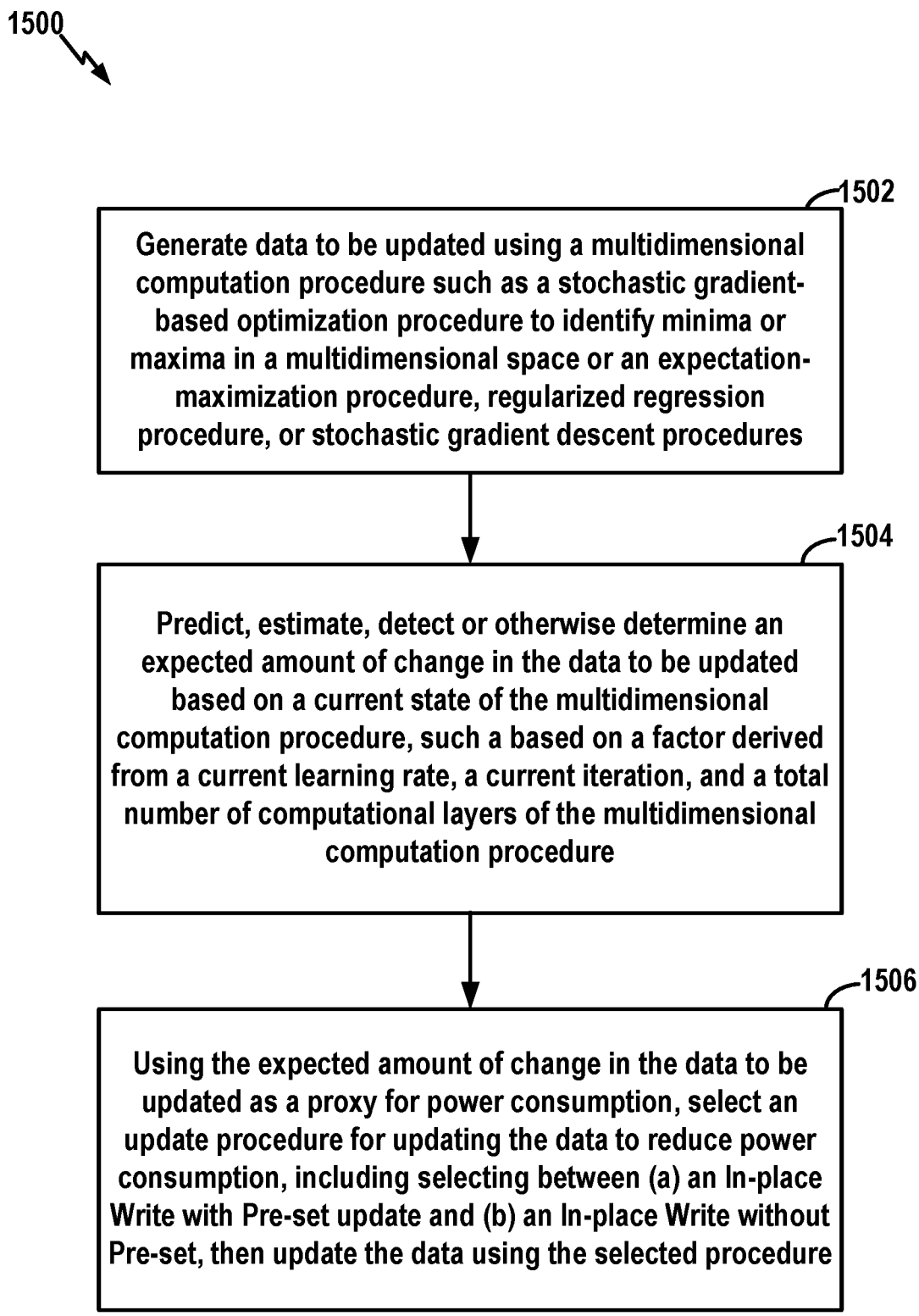
FIG. 15 illustrates a flow chart that summarizes still other exemplary operations performed by a storage device having an NVM array configured for bit-addressable writes.

FIG. 15 illustrates a process 1500 in accordance with some aspects of the disclosure. The process 1500 may take place within any suitable apparatus or device capable of performing the operations, such as a DSD with SCM. At block 1502, the apparatus generates data to be updated using a multidimensional computation procedure such as a stochastic gradient-based optimization procedure to identify minima or maxima in a multidimensional space or an expectation-maximization procedure, regularized regression procedure, or stochastic gradient descent procedures. At block 1504, the apparatus predicts, estimates, detects or otherwise determines an expected amount of change in the data to be updated based on a current state of the multidimensional computation procedure, such a based on a factor derived from a current learning rate, a current iteration, and a total number of computational layers of the multidimensional computation procedure. At block 1506, using the expected amount of change in the data to be updated as a proxy for power consumption, the apparatus selects an update procedure for updating the data to reduce power consumption, including selecting between (a) an IPWwP update and (b) an IPW, and then updates the data using the selected procedure.

Figure 16:
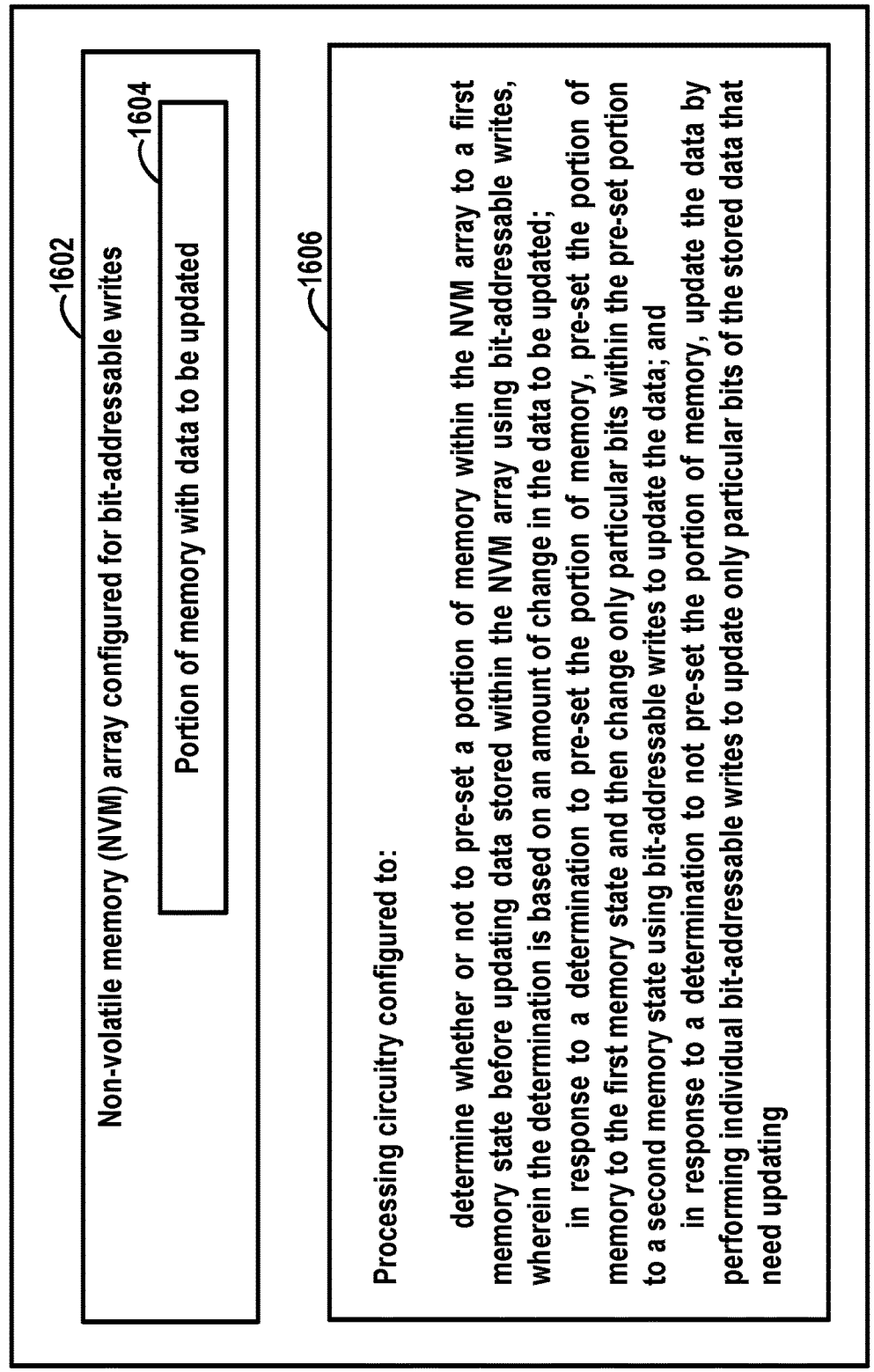
FIG. 16 illustrates a schematic block diagram configuration for an exemplary storage device having an NVM array configured for bit-addressable writes and processing circuitry configured for controlling data updates using bit-addressable writes.

FIG. 16 illustrates an NVM device 1600 configured in accordance with some aspects of the disclosure. The NVM device 1600 includes an NVM array 1602 configured for bit-addressable writes, which includes a portion of memory 1604 with data to be updated. The NVM device 1600 includes a processing circuit 1606 is configured to determine whether or not to pre-set a portion of memory 1604 within the NVM array to a first memory state before updating data stored within the NVM array using bit-addressable writes, wherein the determination is based on an amount of change in the data to be updated. The processing circuit 1606 is further configured to, in response to a determination to pre-set the portion of memory, pre-set the portion of memory 1604 to the first memory state and then change only particular bits within the pre-set portion to a second memory state using bit-addressable writes to update the data. The processing circuit 1606 is additionally configured to, in response to a determination to not pre-set the portion of memory 1604, update the data by performing individual bit-addressable writes to update only particular bits of the stored data that need updating.

In at least some examples, means may be provided that correspond to components illustrated in FIG. 16 and/or other components or functions illustrated or described herein. For example, the means may include one or more of: means for determining whether or not to pre-set a portion of memory within an NVM array configured for bit-addressable writes to a first memory state before updating data stored within the NVM array using bit-addressable writes, wherein the determination is based on an amount of change in the data to be updated; means, operative in response to a determination to pre-set the portion of memory, for pre-setting the portion of memory to the first memory state and for then changing only particular bits within the pre-set portion to a second memory state using bit-addressable writes to update the data; and means, operative in response to a determination to not pre-set the portion of memory, for updating the data by performing individual bit-addressable writes to change selected bits from the first memory state to the second memory state and to change other selected bits from the second memory state to the first memory state.

Figure 17:
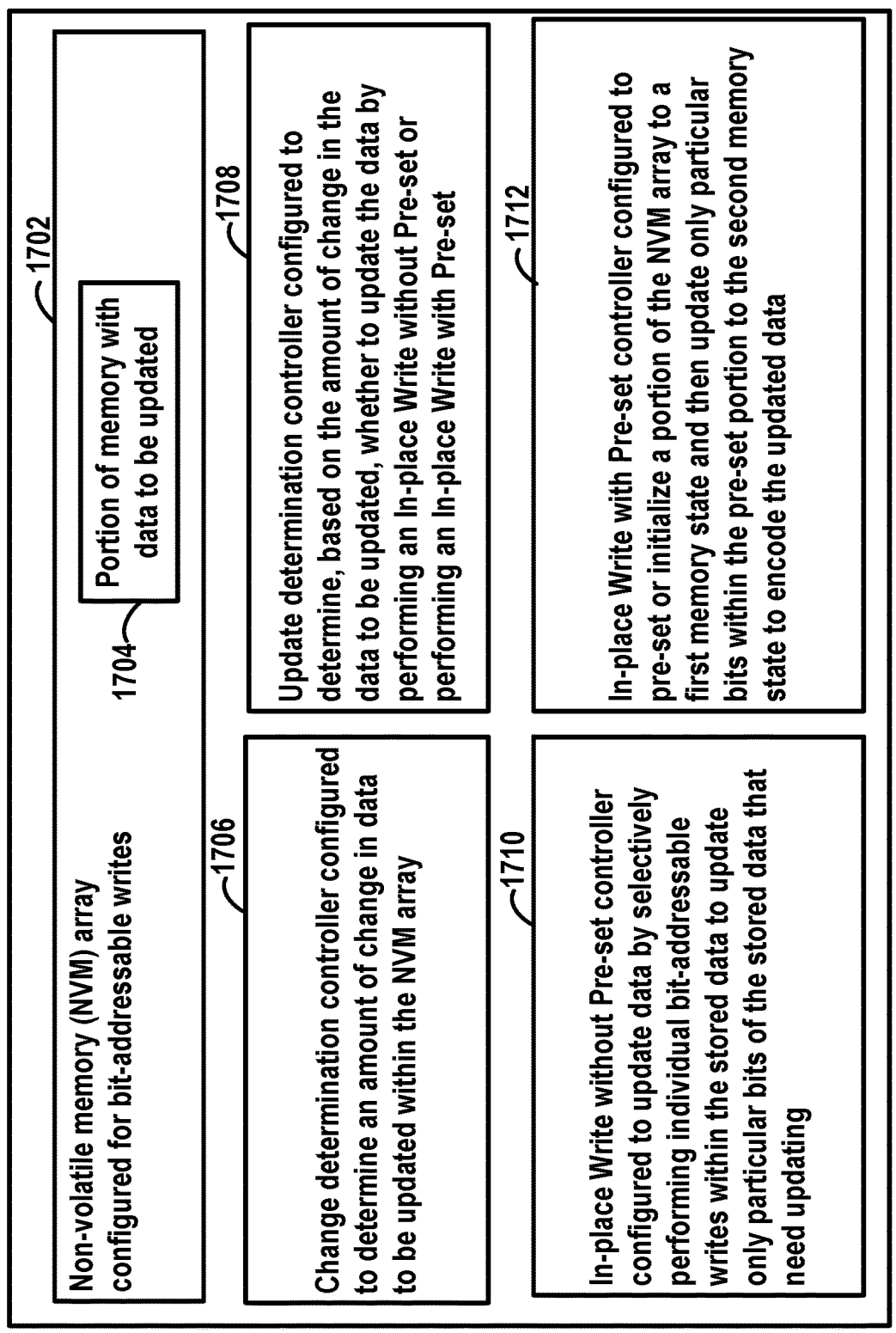
FIG. 17 illustrates a schematic block diagram configuration for another exemplary storage device having an NVM array configured for bit-addressable writes and processing components configured for controlling data updates using bit-addressable writes.

FIG. 17 illustrates an NVM device 1700 configured in accordance with some other aspects of the disclosure. The NVM device 1700 includes an NVM array 1702 configured for bit-addressable writes, which includes a portion of memory 1704 with data to be updated. The NVM device 1700 also includes a change determination controller 1706 configured to determine an amount of change in data to be updated within the NVM array. An update determination controller 1708 is configured to determine, based on the amount of change in the data to be updated, whether to update the data by performing an IPW (e.g. a RMW) or performing an IPWwP. An IPW controller 1710 is configured to update data by selectively performing individual bit-addressable writes within the stored data to update only particular bits of the stored data that need updating. An IPWwP controller 1712 is configured to pre-set or initialize a portion of the NVM array to a first memory state and then update only particular bits within the pre-set portion to the second memory state to encode the updated data.

In at least some examples, means may be provided that correspond to components illustrated in FIG. 17. For example, the means may include one or more of: means for determining an amount of change in data to be updated within the NVM array that is configured for bit-addressable writes; means for determining, based on the amount of change in the data to be updated, whether to update the data by performing an IPW or performing an IPWwP; means for updating the data, in response to a determination to perform the IPW, by selectively performing individual bit-addressable writes within the stored data to update only particular bits of the stored data that need updating; and means for updating the data, in response to a determination to perform the IPWwP, by pre-setting a portion of the NVM array to a first memory state and then updating only particular bits within the pre-set portion to the second memory state to encode the updated data.

Figure 18:
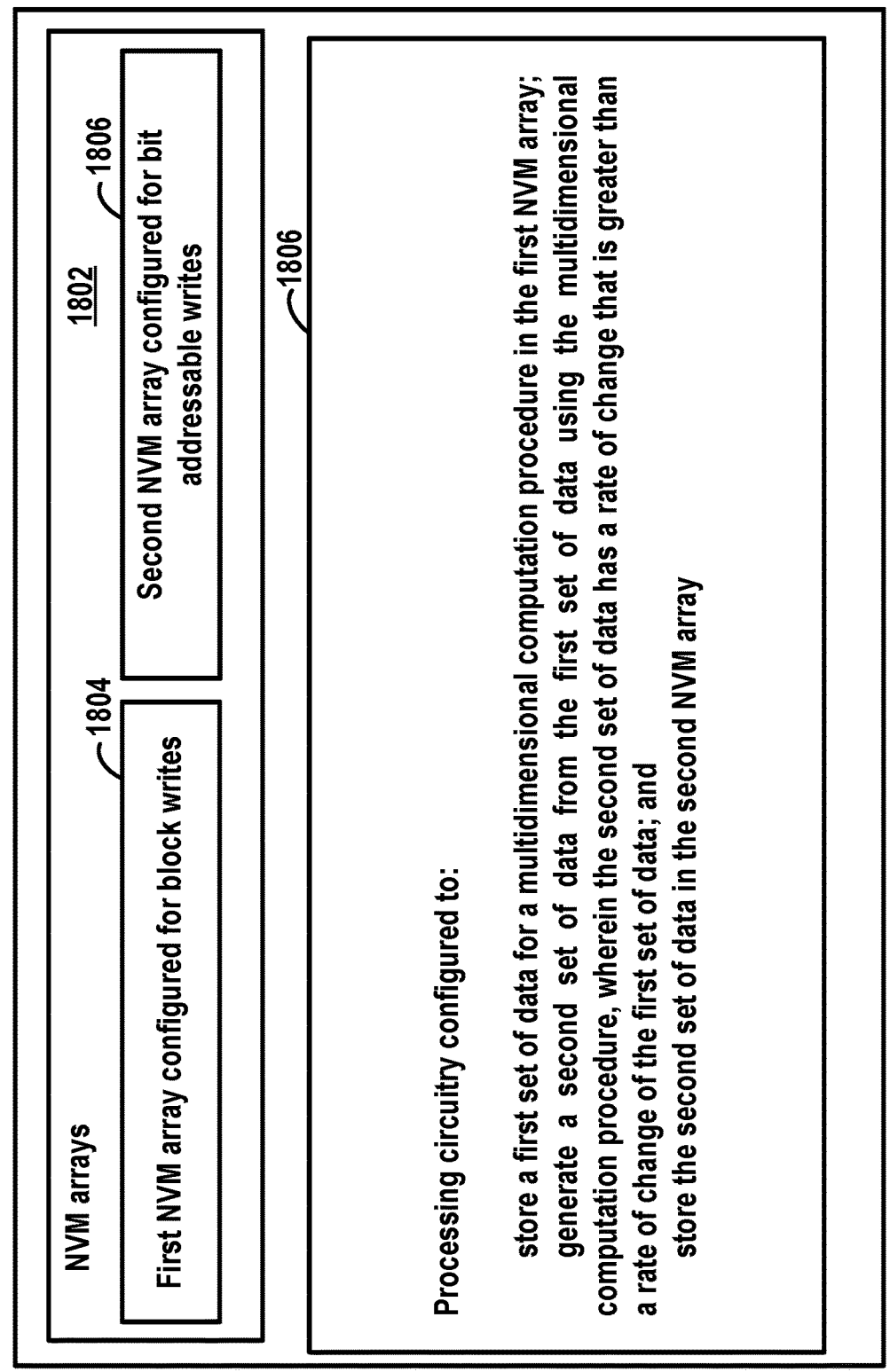
FIG. 18 illustrates a schematic block diagram configuration for an exemplary storage device having an NVM array configured for bit-addressable writes and another NVM array configured for block writes and also having processing components configured for controlling data updates within the two NVM arrays.

FIG. 18 illustrates a storage device 1800 configured in accordance with some aspects of the disclosure. The storage device 1800 includes NVM arrays 1802, including a first NVM array configured for block writes and a second NVM array configured for bit-addressable writes. The storage device 1800 also includes processing circuitry configured to: store a first set of data for a multidimensional computation procedure in the first NVM array; generate a second set of data from the first set of data using the multidimensional computation procedure, wherein the second set of data has a rate of change that is greater than a rate of change of the first set of data; and store the second set of data in the second NVM array.

In at least some examples, means may be provided that correspond to components illustrated in FIG. 18. For example, the means may include one or more of: means for storing a first set of data for a multidimensional computation procedure in the first NVM array; means for generating a second set of data from the first set of data using the multidimensional computation procedure, wherein the second set of data has a rate of change that is greater than a rate of change of the first set of data; and means for storing the second set of data in the second NVM array.

Figure 19:
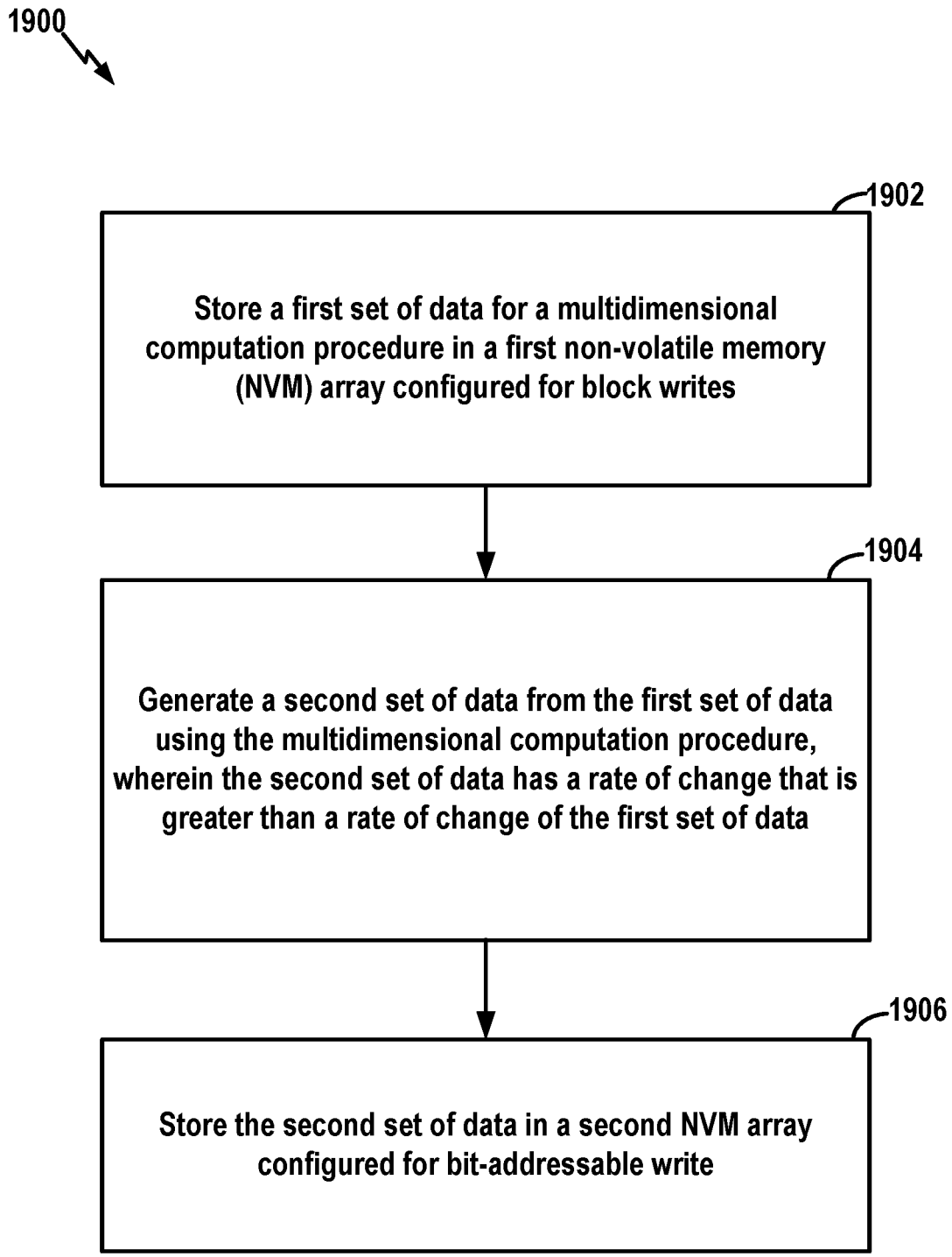
FIG. 19 illustrates a flow chart that summarizes exemplary operations performed by a storage device having an NVM array configured for bit-addressable writes and another NVM array configured for block writes.

FIG. 19 illustrates a process 1900 in accordance with some aspects of the disclosure. The process 1900 may take place within any suitable apparatus or storage device capable of performing the operations, such as a DSD with SCM. At block 1902, the storage device stores a first set of data for a multidimensional computation procedure in a first NVM array configured for block writes. At block 1904, the storage device generates a second set of data from the first set of data using the multidimensional computation procedure, wherein the second set of data has a rate of change that is greater than a rate of change of the first set of data. At block 1906, the storage device stores the second set of data in a second NVM array configured for bit-addressable writes.

Figure 20:
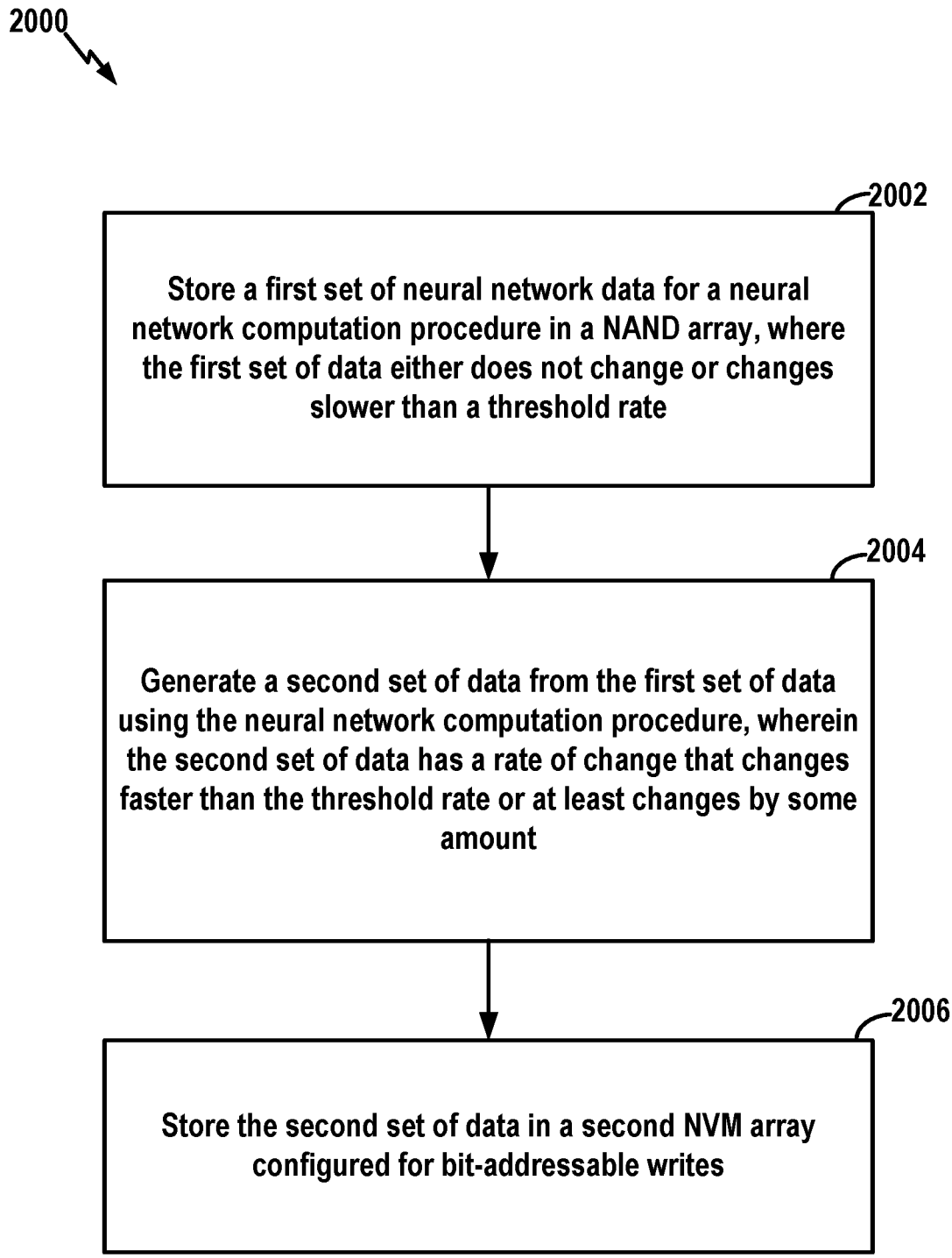
FIG. 20 illustrates a flow chart that summarizes additional exemplary operations performed by a storage device having an NVM array configured for bit-addressable writes and another NVM array configured for block writes.

FIG. 20 illustrates a process 2000 in accordance with some aspects of the disclosure. The process 2000 may take place within any suitable apparatus or storage device capable of performing the operations, such as a DSD with SCM. At block 2002, the storage device stores a first set of neural network data for a neural network computation procedure in a NAND array, where the first set of data either does not change or changes slower than a threshold rate. At block 2004, the storage device generates a second set of data from the first set of data using the neural network computation procedure, wherein the second set of data has a rate of change that changes faster than the threshold rate or at least changes by some amount. At block 2006, the storage device stores the second set of data in a second NVM array configured for bit-addressable writes.

Figure 21:
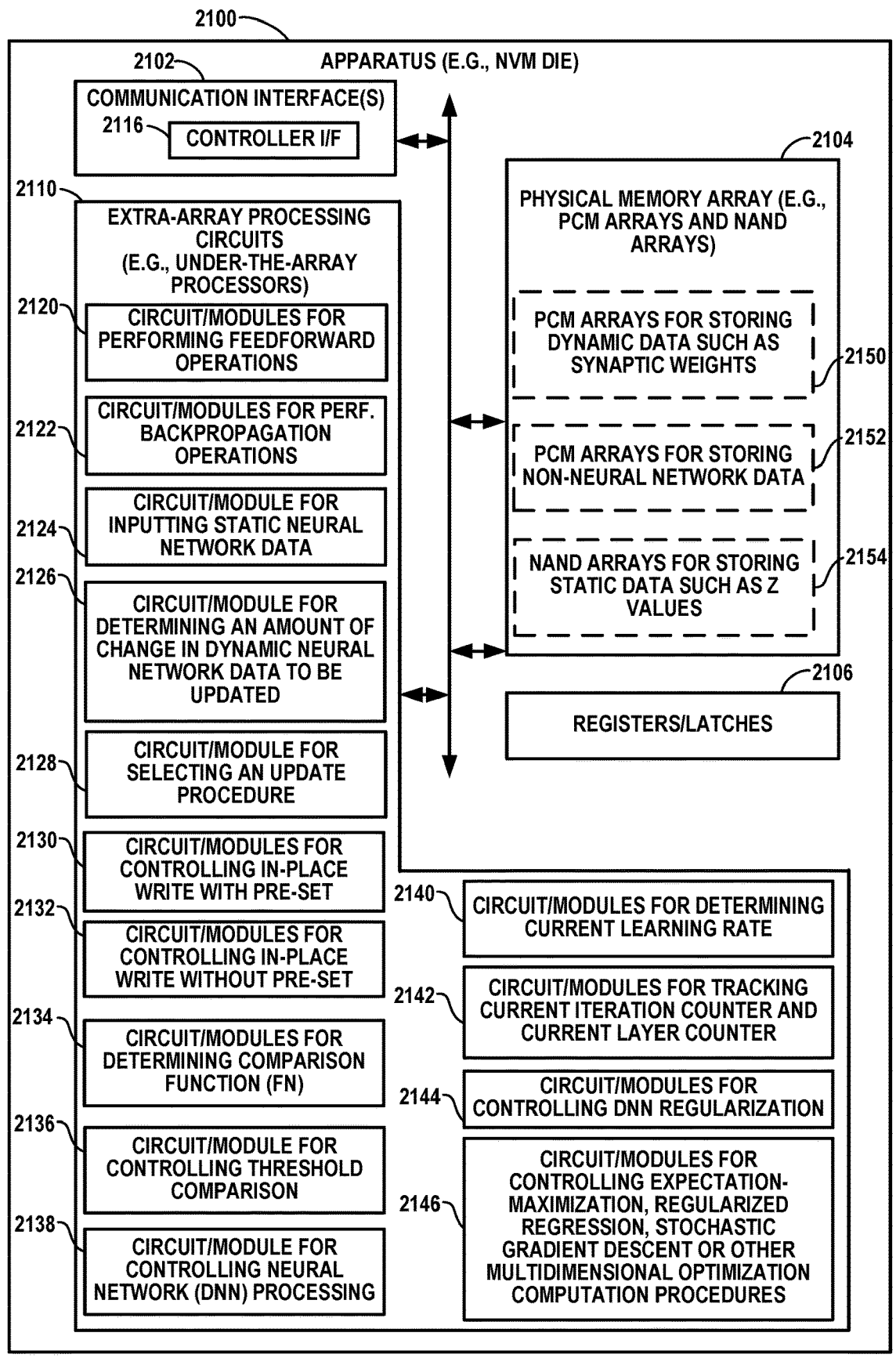
FIG. 21 illustrates a schematic block diagram configuration for an exemplary apparatus, such as an NVM die having both PCM and NAND arrays.

FIG. 21 illustrates an embodiment of an apparatus 2100 configured according to one or more aspects of the disclosure. The apparatus 2100, or components thereof, could embody or be implemented within an NVM die that supports data storage within PCM arrays and within NAND arrays. In various implementations, the apparatus 2100, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes or uses neural data.

The apparatus 2100 includes a communication interface 2102, a physical memory array (e.g., one or more PCM arrays and NAND arrays) 2104, a set or extra-array (e.g. under-the-array) registers and/or latches 2106, and a set of extra-array (e.g. under-the-array (U-A)) processing circuits or processors 2110. These components can be coupled to and/or placed in electrical communication with one another via suitable components, represented generally by the connection lines in FIG. 21. Although not shown, other circuits such as timing sources, peripherals, voltage regulators, and power management circuits may be provided, which are well known in the art, and therefore, will not be described any further.

The communication interface 2102 provides a means for communicating with other apparatuses over a transmission medium. In some implementations, the communication interface 2102 includes circuitry and/or programming (e.g., a program) adapted to facilitate the communication of information bi-directionally with respect to one or more devices in a system. In some implementations, the communication interface 2102 may be configured for wire-based communication. For example, the communication interface 2102 could be a bus interface, a send/receive interface, or some other type of signal interface including circuitry for outputting and/or obtaining signals (e.g., outputting signal from and/or receiving signals into an SSD). The communication interface 2102 serves as one example of a means for receiving and/or a means for transmitting.

The physical memory array 2104 may represent one or more PCM arrays and NAND arrays. The physical memory array 2104 may be used for storing data such as synaptic weights (e.g. ω values) that are manipulated by the processing circuits 2110 or some other component of the apparatus 2100. The physical memory array 2104 may be coupled to the processing circuits 2110 (via, e.g., registers/latches 2106) such that the processing circuits 2110 can read or sense information from, and write or program information to, the physical memory array 2104. That is, the physical memory array 2104 can be coupled to the processing circuits 2110 so that the physical memory array 2104 is accessible by the processing circuits 2110. The processing circuits 2110 are arranged or configured to obtain, process and/or send data, control data access and storage, issue or respond to commands, and control other desired operations. For example, the processing circuits 2110 may be implemented as one or more processors, one or more controllers, and/or other structures configured to perform functions.

According to one or more aspects of the disclosure, the processing circuits 2110 may be adapted to perform the various on-chip features, processes, functions, operations and/or routines described herein. For example, the processing circuits 2110 may be configured to perform some or all of the steps, functions, and/or processes described with respect to FIGS. 1-20. As used herein, the term "adapted" in relation to the processing circuit 2110 may refer to the processing circuits 2110 being one or more of configured, employed, implemented, and/or programmed to perform a particular process, function, operation and/or routine according to various features described herein. The processing circuits 2110 may include a specialized processor, such as an application specific integrated circuit (ASIC) that serves as a means for (e.g., structure for) carrying out some or all of the operations described in conjunction with FIGS. 1-20. The processing circuits 2110 serves as one example of a means for processing. In various implementations, the processing circuits 2110 may provide and/or incorporate, at least in part, the functionality described above for the extra-array components 654 of FIG. 6.

According to at least one example of the apparatus 2100, the processing circuit 2110 may include one or more of: circuit/modules 2120 configured to perform feedforward operations; circuit/modules 2122 configured to perform backpropagation operations; a circuit/module 2124 configured to input static neural network input data (e.g. z values or training values that stored in a NAND array); a circuit/module 2126 configured to determine an amount of change in dynamic neural network data to be updated; circuit/modules 2128 configured to select an update procedure (such as selecting between the IPWwP and the IPW); circuit/modules 2130 configured to control (and execute) the IPWwP; circuit/modules 2132 configured to control (and execute) the IPW; circuit/modules 2134 configured to determine the comparison function FN (described above); circuit/modules 2136 configured to control threshold comparison (in which the value of the function FN is compared against one or more thresholds to determine which update procedure to use); circuit/modules 2138 configured to control neural network (DNN) processing, such as by controlling the feedforward and backpropagation operations of circuit 2120 and 2222; circuit/modules 2140 configured to determine a current learning rate (which may be a component of the comparison function FN); circuit/modules 2142 for tracking a current iteration counter and a current layer counter (which may be used in computing the comparison function FN); circuit/modules 2144 for controlling DNN regularization (by, e.g., selectively choosing not to update synaptic weights to avoid overfitting, as discussed above); and circuit/modules 2146 for controlling one or more of expectation-maximization, regularized regression, and/or stochastic gradient descent procedures or other multidimensional (minima/maxima) optimization computation procedures (by, e.g., generating dynamic data stored in connection with those procedures).

As shown in FIG. 21, the physical memory array 2104 may include one or more of: PCM arrays 2150 for storing dynamic data (such as ω values); arrays 2152 for storing non-neural network data (such as user data); and NAND arrays 2154 for storing static data (such as z values). In other examples, the static data may be stored in a separate NAND die.

In at least some examples, means may be provided that correspond to components illustrated in FIG. 21 and/or other functions illustrated or described herein. For example, the means may include one or more of: means, such as circuit/module 2120, for performing feedforward operations; means, such as circuit/module 2122, for performing backpropagation operations; means, such as circuit/module/component 2124, for inputting static neural network input data (e.g. z values or training values); means, such as circuit/module 2126, for determining an amount of change in dynamic neural network data to be updated; means, such as circuit/module 2128, for selecting an update procedure (such as selecting between the IPWwP and the IPW); means, such as circuit/module 2130, for controlling (or executing) the IPWwP; means, such as circuit/module 2132, for controlling (or executing) the IPW; means, such as circuit/module 2134, for determining the comparison function FN; means, such as circuit/module 2136, for controlling threshold comparison (in which the value of the function FN is compared against one or more thresholds to determine which update procedure to use; means such as circuit module 2138, for controlling neural network (DNN) processing; means, such as circuit module 2140, for determining a current learning rate (which may be a component of the comparison function FN); means, such as circuit/modules 2142, for controlling tracking a current iteration counter and a current layer counter (which may be used in computing the comparison function FN); means, such as circuit/modules 2144, for controlling DNN regularization (by, e.g., selectively choosing not to update synaptic weights to avoid overfitting, as discussed above); means, such as circuit/modules 2146, for controlling one or more of expectation-maximization, regularized regression, stochastic gradient descent or other multidimensional (minima/maxima) optimization computation procedures; means, such as storage block 2150, for storing dynamic data; and means, such as storage block 2152, for storing non-neural network data (e.g. regular user data).

Still further, in at least some examples, non-transitory machine-readable instructions may be provided for controlling the functions illustrated in the various figures and/or other functions illustrated or described herein.

Further Information Regarding PCM Arrays

Further information regarding PCM arrays may be found in U.S. patent application Ser. No. 16/295,969, filed Mar. 7, 2019, entitled "ENHANCED BURST MODE OPERATION OF A MEMORY DEVICE," of Bazarsky et al., which is assigned to the assignee of the present application. Within that document, a burst write is described that shares at least some features in common with the IPWwP of the present disclosure. Herein-below, portions of that document are included in abbreviated form to provide further information regarding PCM cells and the SET and RESET operations.

Techniques may be provided to reduce burst write latency in a bit-addressable non-volatile memory having an asymmetric state change characteristic, such as a phase change memory device. In some examples, a SET state transition background operation is applied to a dedicated burst write partition to shift selected memory cells into a SET state. A "background operation" refers to management operations that can be performed when the NVM system is not processing any host requests (such as burst write operations). For example, configuring a dedicated burst write partition size and location, and configuring memory cells of the dedicated burst write partition into the SET state are background operations because they may be performed and completed prior to and therefore do not block a burst write operation. A "dedicated burst write partition" is a set of memory addresses configured for favored use by burst write operations. A dedicated burst write partition is typically, but not necessarily, a contiguous range of physical addresses within a memory array. A dedicated burst write partition may be used exclusively for burst write operations or may be used opportunistically for other-than-burst write operations as well as for burst write operations.

After preparing the dedicated burst write partition, a foreground operation RESET state transition is applied to selected memory cells from the set placed into the SET state. A "foreground operation" is other than a background operation, e.g., actions that involve processing a host request and thus do not interrupt or delay a burst write operation or memory read operation and thus compete with host request fulfillment for resources of the memory system. The selected memory cells are cells identified to be placed into a high resistive state so as to be programmed using a RESET state transition. The phase change memory RESET state transition is faster (e.g., 8× faster) than the SET state transition. Burst write latency may thus be reduced by shifting an entire memory block into a low resistance crystalline state (SET state) in a background operation, and then programming selected cells for the high resistive state using a faster RESET pulse.

A phase change memory cell includes a top electrode, a bottom electrode, and a phase change material. Electric current passes from the top electrode to the bottom electrode by way of a heater region between regions of an insulator. The electric charge from the top electrode is funneled into the heater region by the insulator, causing the heater region to heat up. This creates a phase change in the phase change material forming a programmed region. The phase change material exhibits switching characteristics near a threshold voltage $V_{th}$. Below $V_{th}$, the phase change material exhibits high resistance and switches to a low-resistance conductive state at or slightly above $V_{th}$. A READ pulse does not have sufficient voltage or current to induce a phase change. However the SET pulse has sufficient current and voltage to induce a SET state transition, and the RESET pulse, with even higher current, induces a RESET state transition. The crystalline lattice structure of the phase change material undergoes operationally distinct transformations above the threshold voltage depending on the magnitude of the current applied. At each state the phase change material exhibits a different resistivity factor. Such phase change materials may be formed for examples using combinations of germanium (Ge), antimony (Sb), and tellurium (Te). Binary state phase change materials take the longest to transition past the threshold voltage to the SET state. From the SET state the RESET state can be programmed by applying relatively short current pulses of higher amplitude.

In one embodiment a phase change memory programming process prepares a dedicated burst write partition with all memory cells in the crystalline SET state. Burst write operations for data bits not represented by the SET state are dynamically directed to the burst write partition, reducing burst write latency and improving memory programming bandwidth in burst write mode. During the burst write operation memory cells are programmed using only the faster RESET pulses and are only programmed if the data is not represented by the SET state. Depending on the implementation, the SET state may represent a logical one or a logical zero. For non-burst write mode operations, conventional phase change memory programming operations are applied to other areas (not the dedicated burst write partition) of the phase change memory.

In some examples, a sub-region less than the entire dedicated burst write partition is conditioned into the SET state enabling a tradeoff of the latency for the background operation and the time and capacity available to carry out the burst write operations. This is effectively the same as conditioning the dedicated burst write partition in stages, for example as background operation resources come available. In other words, it's a dedicated burst write partition of dynamic size that changes over time.

A modern phase change memory system may utilize a RESET pulse length as short as one eighth the duration of the SET pulse length. For a SET pulse of length X and RESET pulse of length ⅛X and assuming an equal number of '0' and '1' values in the burst write operation data, a phase change memory programming process can reduce the write latency by a factor of four (4). For a worst-case scenario in which all of the burst write operation data is to be programmed to the RESET state the latency is reduced by a factor of eight (8). Burst mode operation of phase change memory devices may thus be substantially improved using these techniques in many cases. Once the memory cells of the dedicated burst write partition are conditioned into the SET state, it is unnecessary to read them before performing a programming operation during a burst write operation, which achieves additional performance benefits.

ADDITIONAL ASPECTS

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable SCM such PCM, MRAM, ReRAM, ST-MRAM, and in 3D XPOINT arrays. Other aspects of the subject matter described herein can be implemented in any suitable NAND flash memory, such as 3D NAND flash memory or other NVM devices. More generally, semiconductor memory devices include working memory devices, such as DRAM or SRAM devices, NVM devices, ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "one or more of A, B, and C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" and "one or more of A, B, and C" are intended to cover A, B, C, A-B, A-C, B-C, and A-B-C, as well as multiples of the same members (e.g., any lists that include AA, BB, or CC). Likewise, "at least one of: A, B, and C" and "one or more of A, B, and C" are intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A device, comprising:
a non-volatile memory (NVM) array configured for bit-addressable writes; and
processing circuitry configured to:
determine whether or not to pre-set a portion of memory within the NVM array to a first memory state before updating data stored within the NVM array, wherein the determination is based on an amount of change in the data to be updated;
in response to a determination to pre-set the portion of memory, pre-set the portion of memory to the first memory state and then change only particular bits within the pre-set portion to a second memory state using bit-addressable writes to update the data; and
in response to a determination to not pre-set the portion of memory, update the data by performing bit-addressable writes to update only particular bits of the stored data that need updating.

2. The device of claim 1, wherein the NVM array is configured to perform bit-addressable writes by (a) applying a set pulse to change bits to the first memory state from the second memory state and (b) applying a re-set pulse to change bits to the second memory state from the first memory state, where the set pulse takes longer than the re-set pulse to change the state of a bit.

3. The device of claim 2, wherein the processing circuitry is further configured, in response to a determination to pre-set the portion of memory, to:
pre-set all of the bit states of the portion of the NVM array to the first memory state by applying the set pulse to each bit within the portion of the NVM array; and
change selected bits from the first memory state to the second memory state to encode updated data in the NVM array by applying the re-set pulses to the selected bits.

4. The device of claim 1, wherein the processing circuitry is further configured to determine whether or not to pre-set the portion of memory within the NVM by comparing the amount of change in the data to be updated against a threshold, and to then pre-set the portion of memory if the amount is at or above the threshold.

5. The device of claim 4, wherein the processing circuitry is further configured to determine the amount of change in the data to be updated by one or more of predicting or estimating the amount of change in the data to be updated.

6. The device of claim 4, wherein the data to be updated is generated from a multidimensional computation procedure and the processing circuitry is further configured to determine the amount of change in the data to be updated based on a current state of the multidimensional computation procedure.

7. The device of claim 6, wherein the multidimensional computation procedure is a neural network computation procedure and the processing circuitry is further configured to determine the amount of change in the data to be updated based on a factor derived from a current learning rate of the neural network computation procedure.

8. The device of claim 7, wherein the processing circuitry is further configured to repeat the determination at least once every iteration of the neural network computation procedure.

9. The device of claim 6, wherein the processing circuitry is further configured to regularize the data by selectively disabling the updating of the data.

10. The device of claim 6, wherein the processing circuitry is further configured to regularize the data by applying updates to only a portion of the data to be updated.

11. The device of claim 1, wherein the NVM array comprises one of more of a phase-change memory (PCM) array, a magneto-resistive random access memory (MRAM) array, a resistive random access memory (ReRAM) array, and a three-dimensional cross-point (3D XPOINT) array.

12. A method for use by a device that includes a non-volatile memory (NVM) array configured for bit-addressable writes, the method comprising:
    determining an amount of change in data to be updated within the NVM array;
    determining, based on the amount of change in the data to be updated, whether to update the data by performing an in-place write without pre-set or by performing an in-place write with pre-set;
    updating the data, in response to a determination to perform the in-place write without pre-set, by selectively performing individual bit-addressable writes within the data to update only particular bits of the data that need updating; and
    updating the data, in response to a determination to perform the in-place write with pre-set, by pre-setting a portion of the NVM array to a first memory state and then updating only particular bits within the pre-set portion to a second memory state to encode the updated data.

13. The method of claim 12, further comprising
    performing the in-place write without pre-set by using bit-addressable writes to change selected bits from the first memory state to the second memory state and/or to change other selected bits from the second memory state to the first memory state; and
    performing the in-place write with pre-set by initializing all bit states of the portion of the NVM array to the first memory state, then changing selected bits within the portion of the NVM array to the second memory state using bit-addressable writes to encode the updated data into the portion of the NVM array, without changing any bits within the portion of the NVM array from the second memory state to the first memory state.

14. The method of claim 12, further comprising performing the bit-addressable writes by applying a set pulse to a bit to change the bit from the second memory state to the first memory state or by applying a re-set pulse to change the bit from the first state to the second state, where the set pulse takes longer than the re-set pulse to change the state of an individual bit.

15. The method of claim 14, further comprising:
    initializing all of the bit states of the portion of the NVM array to the first state by applying the set pulse to each bit within the portion of the NVM array; and
    changing the selected bits from the first state to the second state to encode updated data in the NVM array by applying the re-set pulse to the selected bits.

16. The method claim 12, further comprising comparing the amount of change in the data to be updated against a threshold, and performing the in-place write without pre-set if the amount is below the threshold, and performing the in-place write with pre-set if the amount is at or above the threshold.

17. The method of claim 12, further comprising determining the amount of change in the data to be updated by one or more of predicting or estimating the amount of change in the data to be updated.

18. The method of claim 12, wherein the data to be updated is generated from a multidimensional computation procedure and the method further comprises determining the amount of change in the data to be updated based on a current state of the multidimensional computation procedure.

19. The method of claim 18, wherein the multidimensional computation procedure is a neural network computation procedure and wherein determining the amount is based on a factor derived from a current learning rate of the neural network computation procedure.

20. The method of claim 19, further comprising repeating the determination at least once every iteration of the neural network computation procedure.

21. The method of claim 12, further comprising regularizing the data by selectively disabling the updating of the data.

22. The method of claim 12, further comprising regularizing the data by applying updates to only a portion of the data to be updated.

* * * * *